US009506956B2

(12) United States Patent
Imai et al.

(10) Patent No.: US 9,506,956 B2
(45) Date of Patent: Nov. 29, 2016

(54) FLOW DIRECTION DETECTION DEVICE, FLOW DIRECTION DETECTION METHOD, AND FLOW DIRECTION DETECTION PROGRAM

(71) Applicant: OMRON Corporation, Kyoto-Shi, Kyoto (JP)

(72) Inventors: Hiroshi Imai, Nara (JP); Ryota Akai, Kyoto (JP); Chen Chen, Kyoto (JP); Yasukazu Ohno, Nara (JP)

(73) Assignee: OMRON Corporation, Kyoto (JP)

(*) Notice: Subject to any disclaimer, the term of this patent is extended or adjusted under 35 U.S.C. 154(b) by 302 days.

(21) Appl. No.: 14/376,659

(22) PCT Filed: Oct. 23, 2012

(86) PCT No.: PCT/JP2012/077288
§ 371 (c)(1),
(2) Date: Aug. 5, 2014

(87) PCT Pub. No.: WO2013/121627
PCT Pub. Date: Aug. 22, 2013

(65) Prior Publication Data
US 2015/0042314 A1    Feb. 12, 2015

(30) Foreign Application Priority Data
Feb. 15, 2012  (JP) ................. 2012-030655

(51) Int. Cl.
*G01R 19/14*  (2006.01)
*G01R 11/00*  (2006.01)
(Continued)

(52) U.S. Cl.
CPC .............. *G01R 19/14* (2013.01); *G01R 11/00* (2013.01); *G01R 11/32* (2013.01);
(Continued)

(58) Field of Classification Search
CPC ....... G01R 11/00; G01R 11/32; G01R 11/34; G01R 11/48

USPC ................. 324/72, 76.11–76.83, 137, 152
See application file for complete search history.

(56) References Cited

U.S. PATENT DOCUMENTS

2008/0036559 A1* 2/2008 Gajic ............... H02H 1/046
                                                    335/7
2009/0289618 A1* 11/2009 Tajima ............ G01R 19/175
                                                    324/127
2013/0245972 A1*  9/2013 Imai ............... G01R 19/2513
                                                    702/60

FOREIGN PATENT DOCUMENTS

JP     11-225440 A     8/1999
JP     2004-279321 A   10/2004
JP     2004-297959 A   10/2004

OTHER PUBLICATIONS

International Search Report for corresponding International Application No. PCT/JP2012/077288, mailed Dec. 11, 2012 (2 pages).

*Primary Examiner* — Jermele M Hollington
*Assistant Examiner* — Raul Rios Russo
(74) *Attorney, Agent, or Firm* — Osha Liang LLP

(57) ABSTRACT

A detection apparatus that detects a state of power has a first current transformer that measures a first current on a side of a first power line with respect to a connecting point between the first power line extending from a commercial power supply and a second power line extending from a power generation means that supplies power having the same frequency as the commercial power supply, a second current transformer that measures a second current on a side of the second power line with respect to the connecting point, a first current direction detector that detects a direction of the first current, a second current direction detector that detects a direction of the second current, and an exclusive OR calculator that calculates an exclusive OR between a detected value of the direction of the first current and a detected value of the direction of the second current.

14 Claims, 19 Drawing Sheets

(51) Int. Cl.
*G01R 11/32* (2006.01)
*G01R 21/133* (2006.01)
*G01R 19/00* (2006.01)
*H02J 13/00* (2006.01)
*G01R 31/40* (2014.01)
*G01R 11/34* (2006.01)
*G01R 11/48* (2006.01)
*G01R 19/25* (2006.01)
*H02J 3/38* (2006.01)

(52) U.S. Cl.
CPC ......... *G01R 19/0092* (2013.01); *G01R 19/25* (2013.01); *G01R 21/133* (2013.01); *H02J 13/00* (2013.01); *H02S 50/00* (2013.01); *G01R 11/34* (2013.01); *G01R 11/48* (2013.01); *G01R 19/2513* (2013.01); *H02J 3/383* (2013.01); *Y02B 10/14* (2013.01); *Y02E 10/563* (2013.01)

FLOW DIRECTION DETECTION DEVICE, FLOW DIRECTION DETECTION METHOD, AND FLOW DIRECTION DETECTION PROGRAM

BACKGROUND

1. Technical Field

The present invention relates to a detection apparatus, method, and program. The present invention particularly relates to a detection apparatus, method, and program that are suitable for use in detecting a state of power in a facility equipped with a private power generation apparatus.

2. Related Art

Along with the widespread use of solar power generation systems and the start of buyback programs for excess power produced from solar power generation systems in recent years, there is a growing need for regular household people to know the amount of power generated by their solar power generation system, the amount of power sold (excess power) from the solar power generation system, the amount of power purchased from a commercial power supply, the amount of power consumed in their house, and the like.

Conventionally, methods have been proposed to determine whether a private power generation apparatus such as a solar power generation system is in a state in which the solar power generation system is supplying excess power to a commercial power supply to sell the power (hereinafter, referred to as a "power selling state") or in a state in which the solar power generation system is purchasing power by receiving supply of power from the commercial power supply (hereinafter, referred to as a "power purchasing state") (see, for example, Patent Documents 1 to 3). According to the inventions disclosed in Patent Documents 1 to 3, whether the solar power generation system is in the power purchasing state or in the power selling state is determined by measuring voltage and current of a power line extending from the commercial power supply, calculating power from the measured voltage and current, and detecting the power flow direction based on whether the calculated power is positive or negative.

Patent Document 1: JP 2004-279321A
Patent Document 2: JP 2004-297959A
Patent Document 3: JP H11-225440A

SUMMARY

In order to measure voltage of a power line extending from a commercial power supply (hereinafter, referred to as a "commercial power line") at a regular household, it is necessary to insert a dedicated measurement device directly into the commercial power line.

However, such a measurement device is required to have high levels of safety and reliability, which results in a high manufacturing cost. Also, it is necessary to perform an installation operation for installing the measurement device, and the supply of power needs to be cut off during the installation operation. Furthermore, a second-class electrician license is required to perform the installation operation, and thus ordinary people cannot perform the installation operation. Additional effort and cost are thus needed. For this reason, it has not been possible to easily introduce equipment for detecting a state of power.

One or more embodiments of the present invention enables detection of a state of power, with ease and at a low cost.

A detection apparatus according to one or more embodiments of the present invention includes: a first current transformer that measures a first current on a side of a first power line with respect to a connecting point between the first power line extending from a commercial power supply and a second power line extending from a power generation means that supplies power having the same frequency as the commercial power supply; a second current transformer that measures a second current on a side of the second power line with respect to the connecting point; a first current direction detection unit that detects a direction of the first current; a second current direction detection unit that detects a direction of the second current; an exclusive OR calculation unit that calculates an exclusive OR between a detected value of the direction of the first current and a detected value of the direction of the second current; and a power flow direction detection unit that detects a power flow direction of the first power line based on the exclusive OR.

In the detection apparatus according to one or more embodiments of the invention, a first current is measured on a side of a first power line with respect to a connecting point between the first power line extending from a commercial power supply and a second power line extending from a power generation means that supplies power having the same frequency as the commercial power supply, a second current is measured on a side of the second power line with respect to the connecting point, a direction of the first current direction is detected, a direction of the second current is detected, an exclusive OR between a detected value of the direction of the first current and a detected value of the direction of the second current is calculated, and a power flow direction of the first power line is detected based on the exclusive OR.

Accordingly, it is possible to detect a power flow direction of power on the commercial power supply side, with ease and at a low cost.

The first current direction detection unit and the second current direction detection unit are configured with, for example, a comparator circuit. The exclusive OR detection unit is configured with, for example, an EXOR circuit, a computation circuit, a microcomputer, or any type of processor. The power flow direction detection unit is configured with, for example, a digital computation circuit, a microcomputer, or any type of processor.

The power flow direction detection unit may be configured to detect the power flow direction of the first power line based on a time length during which the exclusive OR takes a predetermined value within a predetermined detection period.

With this configuration, it is possible to, for example, reduce the number of times interruption processing is performed, and detect a power flow direction of power on the commercial power supply side with less power consumption.

The power flow direction detection unit may be configured to detect a value of the exclusive OR at a predetermined interval, and detect the power flow direction of the first power line based on the number of times the detected value of the exclusive OR takes a predetermined value within a predetermined detection period.

With this configuration, it is possible to, for example, perform strict time management of various processing operations.

The detection apparatus may further include a first full-wave rectification unit that generates a first full-wave rectified waveform of a third current transformed from the first current by the first current transformer, a second full-wave rectification unit that generates a second full-wave rectified waveform of a fourth current transformed from the second current by the second current transformer, a first waveform restoring unit that restores a waveform of the first current based on the first full-wave rectified waveform and the detected value of the direction of the first current, and a second waveform restoring unit that restores a waveform of the second current based on the second full-wave rectified waveform and the detected value of the direction of the second current.

With this configuration, it is possible to, for example, increase current measurement resolution through measurement using AD converters of the same performance, or decrease the resolution of the AD converters while maintaining the same conversion accuracy.

The first full-wave rectification unit and the second full-wave rectification unit are configured with, for example, a full-wave rectification circuit. The first waveform restoring unit and the second waveform restoring unit are configured with, for example, an analog computation circuit, a digital computation circuit, a microcomputer, or any type of processor.

The detection apparatus may further include a rectification unit that rectifies at least one of a third current transformed from the first current by the first current transformer and a fourth current transformed from the second current by the second current transformer, and power generated by the current rectified by the rectification unit may be used as at least one power source.

With this configuration, it is possible to operate the detection apparatus in a stable manner for a long period of time without the need of battery replacement or the like.

The rectification unit is configured with, for example, a full-wave rectification circuit or a half-wave rectification circuit.

The detection apparatus may further include a power calculation unit that calculates a first power supplied from the commercial power supply to the first power line and a second power supplied from the power generation means to the first power line based on a measured value of the first current and the power flow direction of the first power line.

With this configuration, it is possible to measure the amount of power sold from the private power generation apparatus and the amount of power purchased from the commercial power supply, with ease and at a low cost.

The power calculation unit is configured with, for example, a digital computation circuit, a microcomputer, or any type of processor. The first power may be used as, for example, purchased power, and the second power may be used as, for example, power for sale.

The power calculation unit may further calculate a third power supplied to a load connected to the connecting point based on the measured value of the first current, a measured value of the second current, and the power flow direction of the first power line.

With this configuration, it is possible to measure power consumption of the load, with ease and at a low cost.

The third power may be used as, for example, power to be consumed.

The detection apparatus may further include a display unit that displays the first power and the second power.

This configuration makes it possible for the user to easily recognize the amount of power purchased and the amount of power sold.

The display unit is configured with, for example, any type of display apparatus, any type of light-emitting device, or the like.

The power flow direction detection unit can determine that the power flow direction of the first power line is a direction in which power is supplied from the commercial power supply when the first current has an effective value that is greater than an effective value of the second current.

With this configuration, it is possible to prevent a situation in which it is determined that the solar power generation system is in the power selling state regardless of the fact that the solar power generation system is purchasing power from the commercial power supply.

The power flow direction detection unit can determine that the power flow direction of the first power line is a direction in which power is supplied from the commercial power supply when the second current has an effective value that is less than or equal to a specified value.

With this configuration, it is possible to, when determination of the power flow direction is unstable due to the current of the generated power line being very small, prevent a situation in which it is determined that the solar power generation system is in the power selling state regardless of the fact that the solar power generation system is purchasing power from the commercial power supply.

A detection method according to one or more embodiments of the present invention includes: a first measurement step of measuring a first current on a side of a first power line with respect to a connecting point between the first power line extending from a commercial power supply and a second power line extending from a power generation means that supplies power having the same frequency as the commercial power supply, performed by a first current transformer; a second measurement step of measuring a second current on a side of the second power line with respect to the connecting point, performed by a second current transformer; a first current direction detection step of detecting a direction of the first current; a second current direction detection step of detecting a direction of the second current; an exclusive OR calculation step of calculating an exclusive OR between a detected value of the direction of the first current and a detected value of the direction of the second current; and a power flow direction detection step of detecting a power flow direction of the first power line based on the exclusive OR.

In the detection method according to one or more embodiments of the present invention, a first current is measured by a first current transformer on a side of a first power line with respect to a connecting point between the first power line extending from a commercial power supply and a second power line extending from a power generation means that supplies power having the same frequency as the commercial power supply, a second current is measured by a second current transformer on a side of the second power line with respect to the connecting point, a direction of the first current is detected, a direction of the second current is detected, an exclusive OR between a detected value of the direction of the first current and a detected value of the direction of the second current is calculated, and a power flow direction of the first power line is detected based on the exclusive OR.

Accordingly, it is possible to detect a power flow direction of power on the commercial power supply side, with ease and at a low cost.

The first current direction detection step and the second current direction detection step are executed by, for example, a comparator circuit. The exclusive OR calculation step is executed by, for example, an EXOR circuit, a computation circuit, a microcomputer, or any type of processor. The power flow direction detection step is executed by, for example, a digital computation circuit, a microcomputer, or any type of processor.

A detection apparatus according to one or more embodiments of the present invention includes: a first current direction detection unit that detects a direction of a first current measured by a first current transformer on a side of a first power line with respect to a connecting point between the first power line extending from a commercial power supply and a second power line extending from a power generation means that supplies power having the same frequency as the commercial power supply; a second current direction detection unit that detects a direction of a second current measured by a second current transformer on a side of the second power line with respect to the connecting point; an exclusive OR calculation unit that calculates an exclusive OR between a detected value of the direction of the first current and a detected value of the direction of the second current; and a power flow direction detection unit that detects a power flow direction of the first power line based on the exclusive OR.

In the detection apparatus according to one or more embodiments of the present invention, a direction of a first current is detected, the direction of the first current being measured by a first current transformer on a side of a first power line with respect to a connecting point between the first power line extending from a commercial power supply and a second power line extending from a power generation means that supplies power having the same frequency as the commercial power supply, a direction of a second current is detected, the direction of the second current being measured by a second current transformer on a side of the second power line with respect to the connecting point, an exclusive OR between a detected value of the direction of the first current and a detected value of the direction of the second current is calculated, and a power flow direction of the first power line is detected based on the exclusive OR.

Accordingly, it is possible to detect a power flow direction of power on the commercial power supply side, with ease and at a low cost.

The first current direction detection unit and the second current direction detection unit are configured with, for example, a comparator circuit. The exclusive OR detection unit is configured with, for example, an EXOR circuit, a computation circuit, a microcomputer, or any type of processor. The power flow direction detection unit is configured with, for example, a digital computation circuit, a microcomputer, or any type of processor.

A detection method according to one or more embodiments of the present invention includes the following steps performed by a detection apparatus that detects a state of power: a first current direction detection step of detecting a direction of a first current measured by a first current transformer on a side of a first power line with respect to a connecting point between the first power line extending from a commercial power supply and a second power line extending from a power generation means that supplies power having the same frequency as the commercial power supply; a second current direction detection step of detecting a direction of a second current measured by a second current transformer on a side of the second power line with respect to the connecting point; an exclusive OR calculation step of calculating an exclusive OR between a detected value of the direction of the first current and a detected value of the direction of the second current; and a power flow direction detection step of detecting a power flow direction of the first power line based on the exclusive OR.

In the detection method according to one or more embodiments of the present invention, a direction of a first current is detected, the direction of the first current being measured by a first current transformer on a side of a first power line with respect to a connecting point between the first power line extending from a commercial power supply and a second power line extending from a power generation means that supplies power having the same frequency as the commercial power supply, a direction of a second current is detected, the direction of the second current being measured by a second current transformer on a side of the second power line with respect to the connecting point, an exclusive OR between a detected value of the direction of the first current and a detected value of the direction of the second current is calculated, and a power flow direction of the first power line is detected based on the exclusive OR.

Accordingly, it is possible to detect a power flow direction of power on the commercial power supply side, with ease and at a low cost.

The first current direction detection step and the second current direction detection step are executed by, for example, a comparator circuit. The exclusive OR calculation step is executed by, for example, an EXOR circuit, a computation circuit, a microcomputer, or any type of processor. The power flow direction detection step is executed by, for example, a digital computation circuit, a microcomputer, or any type of processor.

A program according to one or more embodiments of the present invention causes a computer to execute processing including: a first current direction detection step of detecting a direction of a first current measured by a first current transformer on a side of a first power line with respect to a connecting point between the first power line extending from a commercial power supply and a second power line extending from a power generation means that supplies power having the same frequency as the commercial power supply; a second current direction detection step of detecting a direction of a second current measured by a second current transformer on a side of the second power line with respect to the connecting point; an exclusive OR calculation step of calculating an exclusive OR between a detected value of the direction of the first current and a detected value of the direction of the second current; and a power flow direction detection step of detecting a power flow direction of the first power line based on the exclusive OR.

With the computer that executes the program according to one or more embodiments of the present invention, a direction of a first current is detected, the direction of the first current being measured by a first current transformer on a side of a first power line with respect to a connecting point between the first power line extending from a commercial power supply and a second power line extending from a power generation means that supplies power having the same frequency as the commercial power supply, a direction of a second current is detected, the direction of the second current being measured by a second current transformer on a side of the second power line with respect to the connecting point, an exclusive OR between a detected value of the direction of the first current and a detected value of the direction of the second current is calculated, and a power flow direction of the first power line is detected based on the exclusive OR.

According to one or more embodiments of the present invention, it is possible to detect a state of power, with ease and at a low cost.

DETAILED DESCRIPTION

Embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. The description will be given in the following order: 1. Embodiments; and 2. Variations.

1. Embodiments

Configuration Example of Power Monitoring System 101

Figure 1:
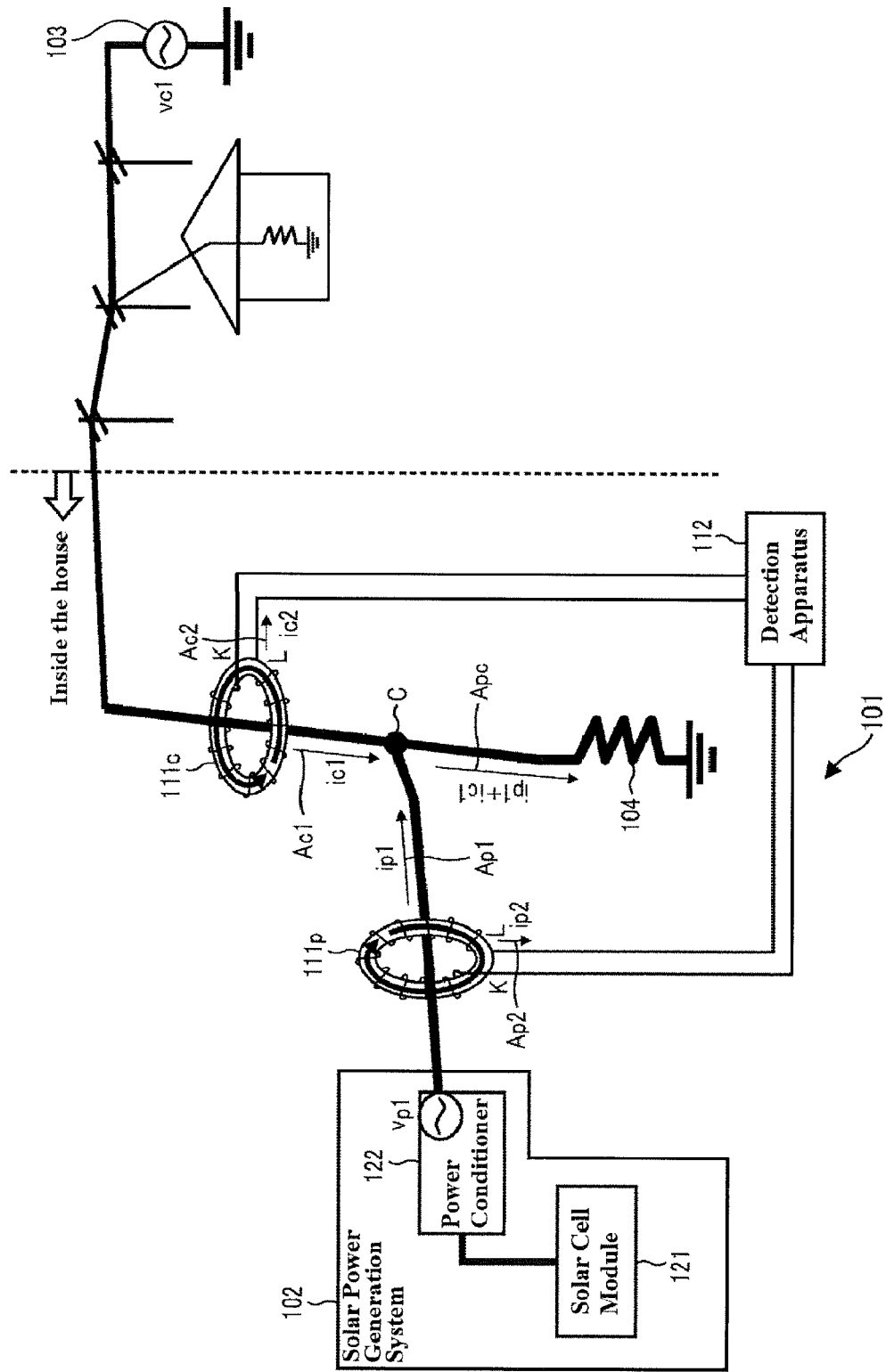
FIG. 1 is a diagram showing a power monitoring system according to one or more embodiments of the present invention, and an example of installation position of current transformers.

FIG. 1 shows a power monitoring system 101 according to one or more embodiments of the present invention, and an example of installation position of current transformers 111$p$ and 111$c$ in the power monitoring system 101.

The following description will be given on the assumption that the area on the left side of the dotted line shown in FIG. 1 shows the inside of a house equipped with a power monitoring system 101 and a solar power generation system 102. Hereinafter, a power line extending from the solar power generation system 102 to a connecting point C will be referred to as a "generated power line", a power line extending from a commercial power supply 103 to the connecting point C will be referred to as a "commercial power line", and a power line extending from the connecting point C to a load 104 will be referred to as a "load power line". The connecting point C is the point where the generated power line and the commercial power line join together, and the load power line is branched. The connecting point C corresponds to, for example, a distribution switch board provided in the house.

In the following description, it is also assumed that all the power lines provided inside the house are of a single-phase two-wire system.

Furthermore, in the following description, it is also assumed that the voltage of the generated power line (=the output voltage of the solar power generation system 102) is denoted by vp1, the current of the generated power line is denoted by ip1, and a direction indicated by the arrow Ap1 is positive. It is also assumed that the voltage of the commercial power line (=the output voltage of the commercial power supply 103) is denoted by vc1, the current of the commercial power line is denoted by ic1, and a direction indicated by the arrow Ac1 is positive. Accordingly, the currents ip1 and ic1 (ip1+ic1) flow into the load power line in a direction indicated by the arrow Apc.

The power monitoring system 101 is a system that detects and monitors the state of power in the house. The power monitoring system 101 includes a current transformer 111$p$, a current transformer 111$c$, and a detection apparatus 112.

The current transformer 111$p$ is provided on wiring between the solar power generation system 102 and the connecting point C, and measures the current ip1 of the generated power line. To be more accurate, the current transformer 111$p$ transforms the current ip1 (primary current) to a current ip2 (secondary current), and supplies the current ip2 to the detection apparatus 112. Hereinafter, it is assumed that the current transformer 111$p$ is installed such that the current ip2 is output from a terminal L and flows in a direction indicated by the arrow Ap2 when the current ip1 flows in the direction of the arrow Ap1.

The current transformer 111$c$ is installed on wiring, provided inside the house, between the commercial power supply 103 and the connecting point C, and measures the current ic1 of the commercial power line. To be more accurate, the current transformer 111c transforms the current ic1 (primary current) to a current ic2 (secondary current), and supplies the current ic2 to the detection apparatus 112. Hereinafter, it is assumed that the current transformer 111c is installed such that the current ic2 is output from a terminal L and flows in a direction indicated by the arrow Ac2 when the current ic1 flows in the direction of the arrow Ac1.

As will be described later, the detection apparatus 112 detects a power flow direction of power of the commercial power line (hereinafter, referred to as "commercial-side power") based on the currents measured by the current transformer 111p and the current transformer 111c, and determines whether the solar power generation system is in the power purchasing state or in the power selling state. Also, the power monitoring system 101 measures generated power from the solar power generation system 102, and power for sale that is excess power of the solar power generation system 102 and is supplied from the solar power generation system 102 to the commercial power line. Furthermore, the power monitoring system 101 measures purchased power supplied from the commercial power supply 103 to the commercial power line, and power for consumption that is supplied from the solar power generation system 102 and the commercial power supply 103 to the load power line and is consumed by the load 104.

The solar power generation system 102 includes a solar cell module 121 and a power conditioner 122.

The solar cell module 121 generates direct current power through solar power generation, and supplies the generated direct current power to the power conditioner 122.

The power conditioner 122 converts the direct current power supplied from the solar cell module 121 into alternating current power having substantially the same voltage and frequency as that of the commercial power supply 103, and at the same time, synchronizes the phase of the voltage of the resulting alternating current power with the phase of the voltage of the commercial power supply 103. Then, the power conditioner 122 outputs the alternating current power (generated power).

A load 104 is configured with an electric device including an electric appliance such as a refrigerator.

Configuration Example of Detection Apparatus 112

Figure 2:
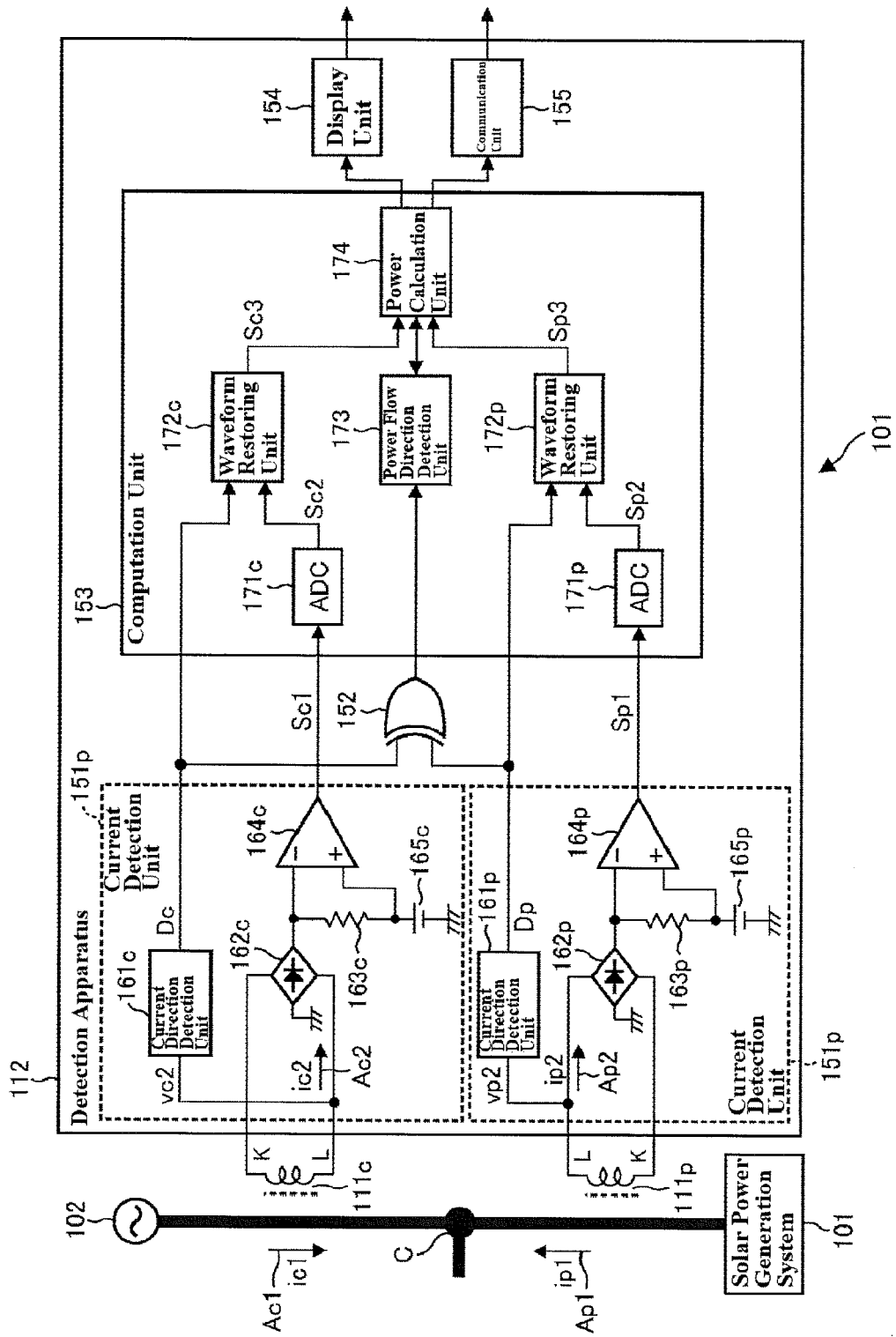
FIG. 2 is a diagram showing a configuration example of a detection apparatus.

FIG. 2 is a block diagram showing a configuration example of the detection apparatus 112.

The detection apparatus 112 includes current detection units 151p and 151c, an EXOR circuit 152, a computation unit 153, a display unit 154, and a communication unit 155.

The current detection unit 151p includes a current direction detection unit 161p, a rectifier 162p, a resistor 163p, an instrumentation amplifier 164p, and a power source 165p.

The current direction detection unit 161p detects the direction of the current ip1, and supplies a current direction detection signal Dp indicating a detected result to the EXOR circuit 152 and to a waveform restoring unit 172p provided in the computation unit 153. To be specific, the current ip2 output from the current transformer 111p is converted into a voltage vp2 by a diode provided in the rectifier 162p and the resistor 163p, and input into the current direction detection unit 161p. The current direction detection unit 161p outputs, when the voltage vp2 takes a positive value, the current direction detection signal Dp at a low level (for example, 0 V), and outputs, when the voltage vp2 takes a negative value, the current direction detection signal Dp at a high level (for example, a predetermined voltage $V_{DD}$).

Accordingly, the current direction detection signal Dp is at a low level when the current ip1 flows in the direction of the arrow Ap1 (when the current ip1 takes a positive value), and is at a high level when the current ip1 flows in a direction opposite the direction of the arrow Ap1 (when the current ip1 takes a negative values). The current direction detection signal Dp output from the current direction detection unit 161p is supplied to the EXOR circuit 152 and the waveform restoring unit 172p.

A configuration example of a circuit of the current direction detection unit 161p will now be described with reference to FIGS. 3 to 5.

Figure 3:
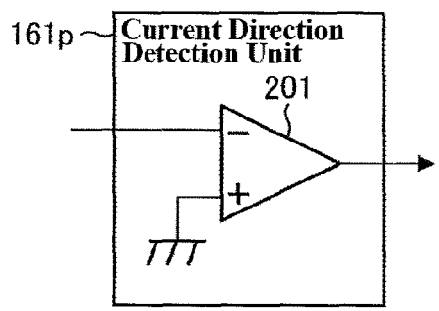
FIG. 3 is a circuit diagram showing a first configuration example of a current direction detection unit.

FIG. 3 shows an example in which the current direction detection unit 161p is configured with a comparator circuit that includes an operational amplifier 201. In this circuit, the voltage vp2 is input into the inverting input terminal (−) of the operational amplifier 201, and the non-inverting input terminal (+) of the same is connected to the ground. When the voltage vp2 input into the inverting input terminal of the operational amplifier 201 takes a positive value, the current direction detection signal Dp at a low level is output. When the voltage vp2 takes a negative value, the current direction detection signal Dp at a high level is output.

Figure 4:
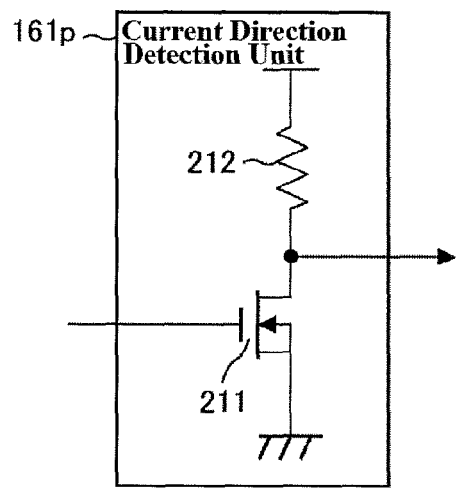
FIG. 4 is a circuit diagram showing a second configuration example of a current direction detection unit.

FIG. 4 shows an example in which the current direction detection unit 161p is configured with an nMOS inverter including an N-type MOSFET 211 and a resistor 212. By setting a threshold voltage with of the MOSFET 211 as appropriate, when the voltage vp2 input into the gate of the MOSFET 211 takes a positive value, the current direction detection signal Dp at a low level is output, and when the voltage vp2 takes a negative value, the current direction detection signal Dp at a high level is output.

Figure 5:
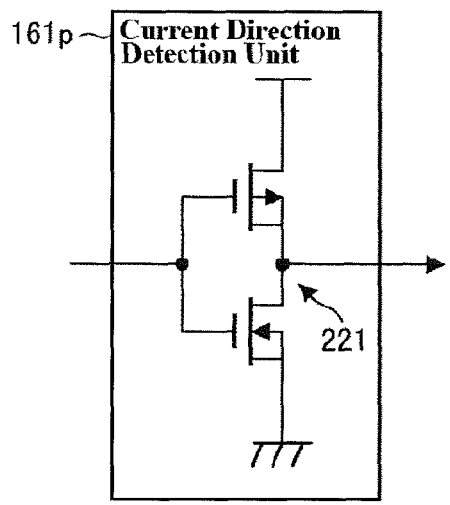
FIG. 5 is a circuit diagram showing a third configuration example of a current direction detection unit.

FIG. 5 shows an example in which the current direction detection unit 161p is configured with a complementary MOS inverter (CMOS inverter) 221. When the voltage vp2 input into the gate of the complementary MOS inverter 221 takes a positive value, the current direction detection signal Dp at a low level is output. When the voltage vc2 takes a negative value, the current direction detection signal Dp at a high level is output.

The circuit shown in FIG. 3 is less susceptible to variations of the threshold value of the MOSFET than the circuits shown in FIGS. 4 and 5, and thus the detection accuracy can be enhanced. With the circuits shown in FIGS. 4 and 5, on the other hand, the circuit scale, the power consumption, and the cost can be reduced with respect to the circuit shown in FIG. 3.

Returning to FIG. 2, the rectifier 162p is configured with a full-wave rectification circuit, and full-wave rectifies the current ip2, which is the alternating current supplied from the current transformer 111p. The current full-wave rectified by the rectifier 162p is converted into a voltage by the resistor 163p, and amplified by a predetermined gain by the instrumentation amplifier 164p. Accordingly, a full-wave rectified signal Sp1 output from the instrumentation amplifier 164p has a waveform substantially equal to the waveform obtained by full-wave rectifying the current ip1. The full-wave rectified signal Sp1 output from the instrumentation amplifier 164p is supplied to an AD converter (ADC) 171p provided in the computation unit 153.

The power source 165p is configured with a rechargeable power source such as a battery. The power source 165p is charged with a current that has been full-wave rectified by the rectifier 162p, and supplies the charged power to each unit of the detection apparatus 112 as power source.

The current detection unit 151c has a circuit configuration similar to that of the current detection unit 151p, and includes a current direction detection unit 161c, a rectifier 162e, a resistor 163c, an instrumentation amplifier 164c, and a power source 165c.

The current direction detection unit 161c has a circuit configuration similar to that of the current direction detection unit 161p. The current direction detection unit 161c detects the direction of the current ic1, and supplies a current direction detection signal Dc indicating a detected result to the EXOR circuit 152 and a waveform restoring unit 172c provided in the computation unit 153. The current direction detection signal Dc is at a low level when the current ic1 flows in the direction of the arrow Ac1, and is at a high level when the current ic1 flows in a direction opposite the arrow Ac1.

FIGS. 6 to 9 show examples of actually measured waveforms of the current direction detection signal Dp and the current direction detection signal Dc that are respectively output from the current direction detection unit 161p and the current direction detection unit 161c, measured at a sampling frequency of 1 ms when the circuit shown in FIG. 3 is used. The commercial power supply 103 is assumed to have a frequency of 60 Hz.

Figure 6:
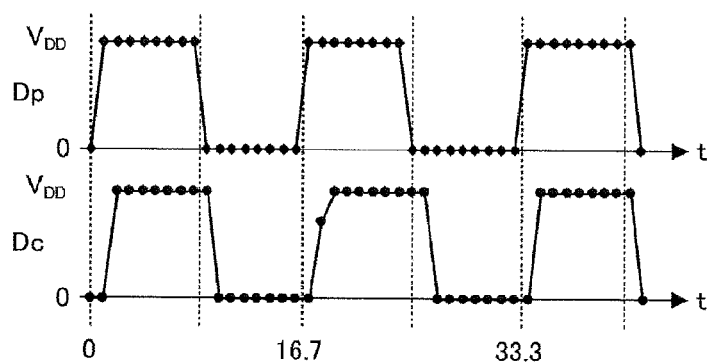
FIG. 6 is a diagram showing a first example of actually measured waveforms of current direction detection signals.
Figure 7:
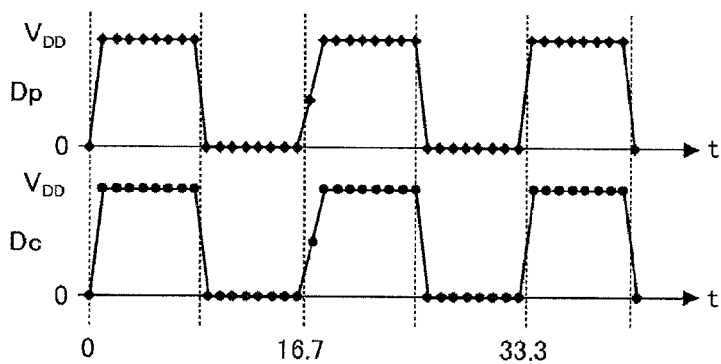
FIG. 7 is a diagram showing a second example of actually measured waveforms of current direction detection signals.
Figure 8:
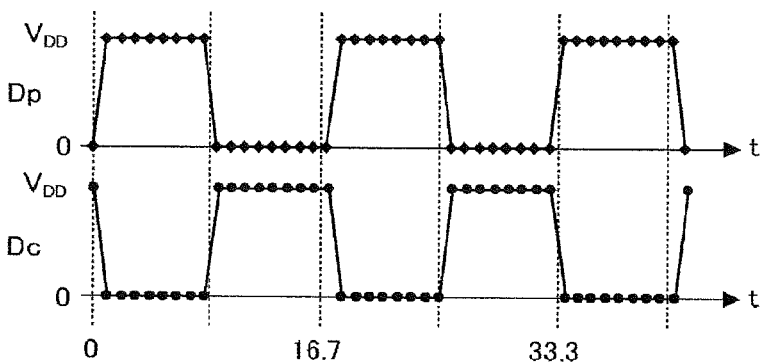
FIG. 8 is a diagram showing a third example of actually measured waveforms of current direction detection signals.
Figure 9:
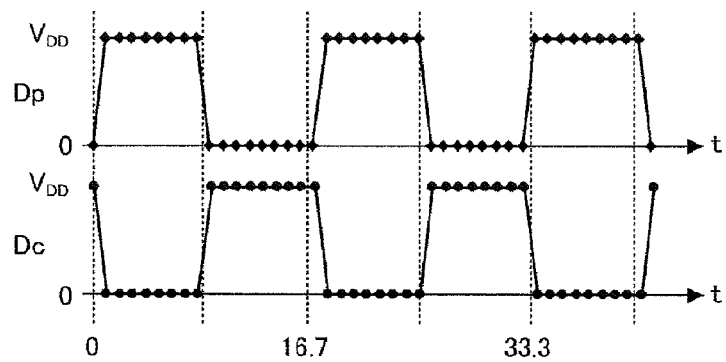
FIG. 9 is a diagram showing a fourth example of actually measured waveforms of current direction detection signals.

FIG. 6 shows waveforms of the current direction detection signal Dp and the current direction detection signal Dc when the phase difference between the current ip1 and the current ic1 is 0 degrees (same phase), and the effective value is 0.1 A. FIG. 7 shows waveforms of the current direction detection signal Dp and the current direction detection signal Dc when the phase difference between the current ip1 and the current ic1 is 0 degrees (same phase), and the effective value is 60 A. FIG. 8 shows waveforms of the current direction detection signal Dp and the current direction detection signal Dc when the phase difference between the current ip1 and the current ic1 is 180 degrees (opposite phase), and the effective value is 0.1 A. FIG. 9 shows waveforms of the current direction detection signal Dp and the current direction detection signal Dc when the phase difference between the current ip1 and the current ic1 is 180 degrees (opposite phase), and the effective value is 60 A.

As shown in FIGS. 6 and 7, when the current ip1 and the current ic1 have the same phase, irrespective of the current value, the current direction detection signal Dp and the current direction detection signal Dc have substantially the same waveform. On the other hand, as shown in FIGS. 8 and 9, when the current ip1 and the current ic1 have opposite phases, irrespective of the current value, the value of the current direction detection signal Dp and the value of the current direction detection signal Dc have substantially opposite waveforms.

Returning to FIG. 2, the rectifier 162c is configured with a full-wave rectification circuit as with the rectifier 162p, and full-wave rectifies the current ic2, which is the alternating current supplied from the current transformer 111c. The current that has been full-wave rectified by the rectifier 162c is converted into a voltage by the resistor 163c, and amplified by a predetermined gain by the instrumentation amplifier 164c. Accordingly, a full-wave rectified signal Sc1 output from the instrumentation amplifier 164c has a waveform substantially equal to the waveform obtained by full-wave rectifying the current ic1. The full-wave rectified signal Sc1 output from the instrumentation amplifier 164c is supplied to an AD converter (ADC) 171c provided in the computation unit 153.

The power source 165c is configured with a rechargeable power source such as a battery, as with the power source 165p. The power source 165c is charged with a current that has been full-wave rectified by the rectifier 162c, and supplies the charged power to each unit of the detection apparatus 112 as power source.

It is also possible to omit either one of the power source 165p and the power source 165c.

The EXOR circuit 152 calculates an exclusive OR between the current direction detection signal Dp and the current direction detection signal Dc, and supplies an EXOR signal indicating the calculated value to a power flow direction detection unit 173 provided in the computation unit 153. The EXOR signal takes a value of 0 (low level) when both the current direction detection signal Dp and the current direction detection signal De are at a high level or a low level, and takes a value of 1 (high level) when one of the current direction detection signal Dp and the current direction detection signal Dc is at a high level, and the other one is at a low level. That is, the EXOR signal takes a value of 0 when the directions (plus/minus signs) of the current ip1 and the current ic1 match, and takes a value of 1 when they do not match.

FIGS. 10 to 13 show examples of actually measured waveforms of the EXOR signal output from the EXOR circuit 152 when the circuit shown in FIG. 4 is used in the current direction detection unit 161p and the current direction detection unit 161c.

Figure 10:
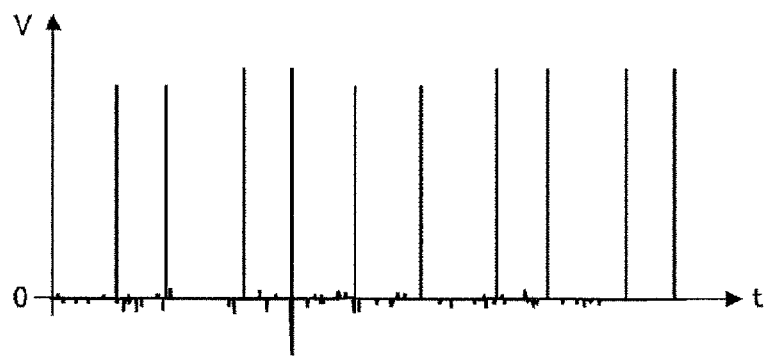
FIG. 10 is a diagram showing a first example of an actually measured waveform of an EXOR signal.
Figure 11:
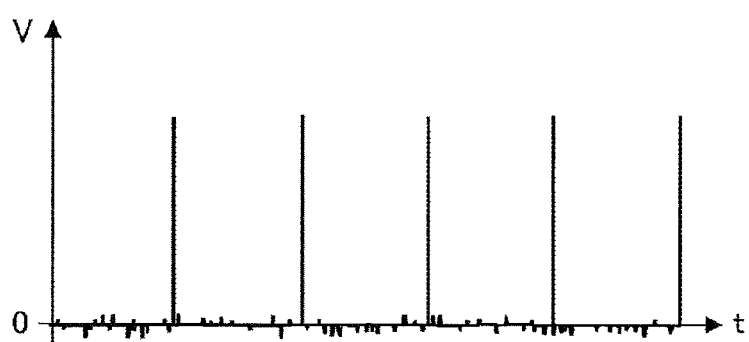
FIG. 11 is a diagram showing a second example of an actually measured waveform of an EXOR signal.
Figure 12:
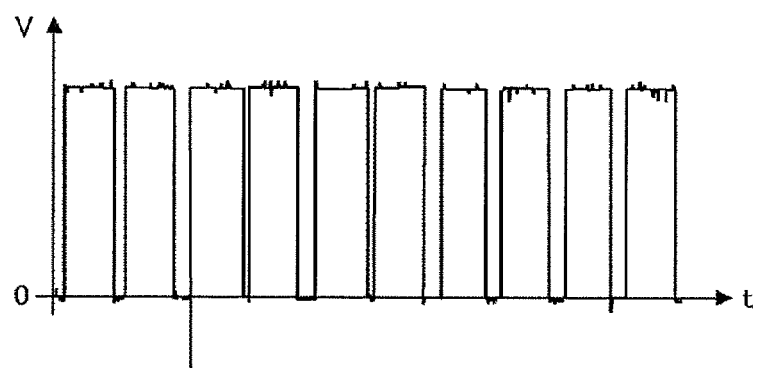
FIG. 12 is a diagram showing a third example of an actually measured waveform of an EXOR
Figure 13:
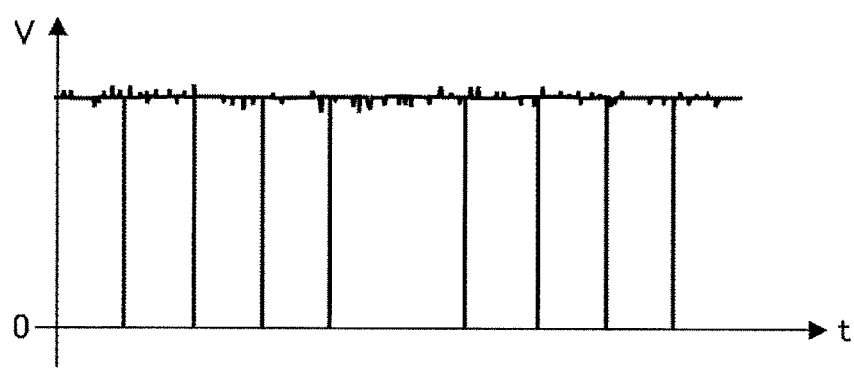
FIG. 13 is a diagram showing a fourth example of an actually measured waveform of an EXOR

FIG. 10 shows a waveform of the EXOR signal when the phase difference between the current ip1 and the current ic1 is 0 degrees (same phase), and the effective value is 0.3 A. FIG. 11 shows a waveform of the EXOR signal when the phase difference between the current ip1 and the current ic1 is 0 degrees (same phase), and the effective value is 100 A. FIG. 12 shows a waveform of the EXOR signal when the phase difference between the current ip1 and the current ic1 is 180 degrees (opposite phase), and the effective value is 0.3 A. FIG. 13 shows a waveform of the EXOR signal when the phase difference between the current ip1 and the current ic1 is 180 degrees (opposite phase), and the effective value is 100 A.

As shown in FIGS. 10 and 11, when the current ip1 and the current ic1 have the same phase, irrespective of the current value, the EXOR signal takes a value of 0 for most of the time. The EXOR signal may take a value of 1 when the waveforms of the current ip1 and the current ic1 have a value closer to 0, but the duration is very short.

On the other hand, as shown in FIGS. 12 and FIG. 13, when the current ip1 and the current ic1 have opposite phases, irrespective of the current value, the EXOR signal takes a value of 1 for most of the time. The EXOR signal may take a value of 0 when the waveforms of the current ip1 and the current ic1 have a value closer to 0, but the duration is very short.

Returning to FIG. 2, the computation unit 153 is configured with, for example, a microcomputer, and implements the functions of the ADCs 171p and 171c, the waveform restoring units 172p and 172c, the power flow direction detection unit 173, and the power calculation unit 174.

The ADC 171p samples the full-wave rectified signal Sp1, which is an analog signal, at a predetermined sampling frequency, and A/D converts the signal into a digital full-wave rectified signal Sp2. The ADC 171p supplies the full-wave rectified signal Sp2 obtained as a result of the conversion to the waveform restoring unit 172p.

The waveform restoring unit 172p generates a restored signal Sp3 in which the waveform of the current ip1 has been restored, based on the full-wave rectified signal Sp2 and the current direction detection signal Dp, as will be described later. Accordingly, the restored signal Sp3 is a digital signal obtained by sampling the value of the current ip1 at a predetermined sampling frequency. The waveform restoring unit 172p supplies the generated restored signal Sp3 to the power calculation unit 174.

The ADC 171c samples the full-wave rectified signal Sc1, which is an analog signal, at a predetermined sampling frequency, and A/D converts the signal into a digital full-wave rectified signal Sc2. The ADC 171c supplies the full-wave rectified signal Sc2 obtained as a result of the conversion to the waveform restoring unit 172c.

The waveform restoring unit 172c generates a restored signal Sc3 in which the waveform of the current ic1 has been restored, based on the full-wave rectified signal Sc2 and the current direction detection signal Dp, as will be described later. Accordingly, the restored signal Sc3 is a digital signal obtained by sampling the value of the current ic1 at a predetermined sampling frequency. The waveform restoring unit 172c supplies the generated restored signal Sc3 to the power calculation unit 174.

The power flow direction detection unit 173 detects the power flow direction of the commercial-side power based on the EXOR signal supplied from the EXOR circuit 152, and effective values of the current ic1 and the current ip1 notified from the power calculation unit 174, and notifies the power calculation unit 174 of a detected result, as will be described later.

The power calculation unit 174 calculates an effective value irc1 of the current ic1 and an effective value irp1 of the current ip1 based on the restored signal Sp3 and the restored signal Sc3, and notifies the power flow direction detection unit 173 of the calculated effective values. The power calculation unit 174 also calculates generated power, power for sale, purchased power, and power for consumption based on the restored signal Sp3, the restored signal Sc3, and a result obtained by detection of the power flow direction of the commercial-side power, as will be described later. The power calculation unit 174 notifies the display unit 154 and the communication unit 155 of the calculated results.

The display unit 154 is configured with, for example, a display apparatus such as a liquid crystal display (LCD), a light-emitting device such as a light emitting diode (LED), or the like, and displays the state of each power.

The communication unit 155 is configured with any type of communication apparatus, and transmits power state information indicating the state of each power to an external apparatus. As the communication method of the communication unit 155, any method, wired or wireless, can be used.

Power Monitoring Processing According to First Embodiment

Figure 14:
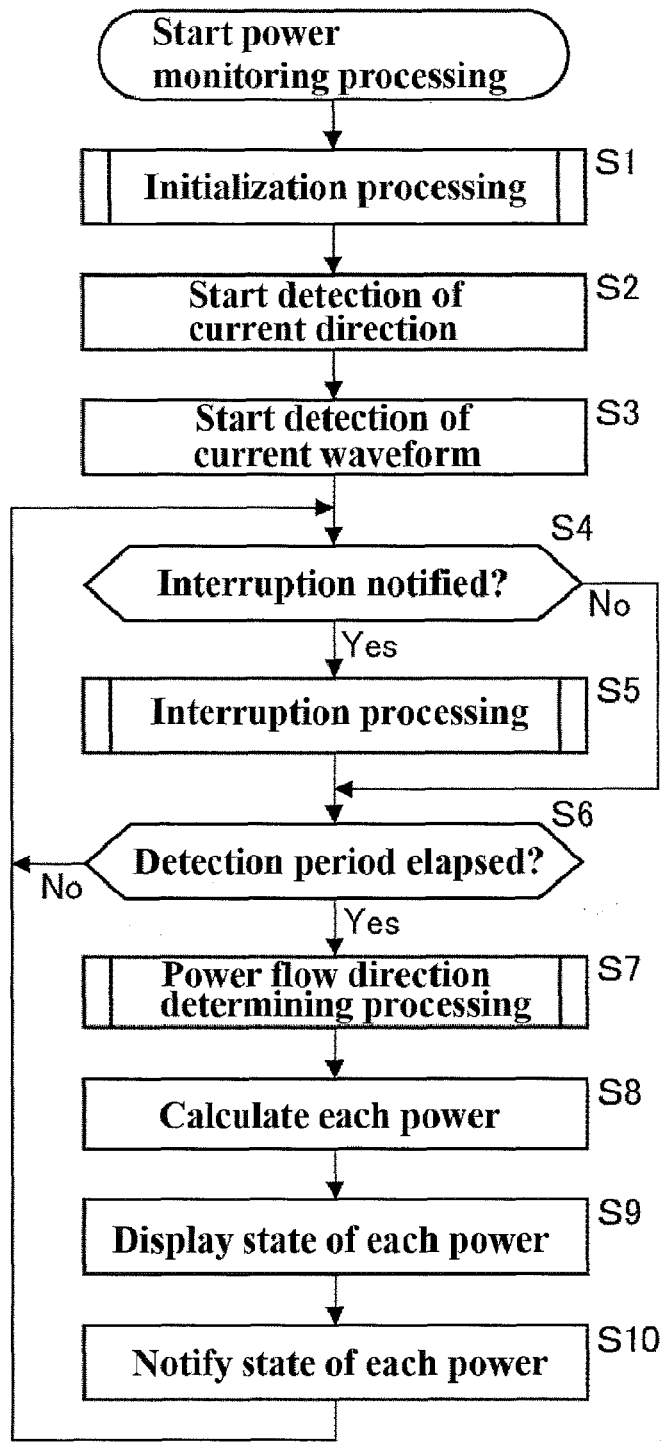
FIG. 14 is a flowchart illustrating power monitoring processing according to a first embodiment.

Next is a description of power monitoring processing according to a first embodiment executed by the power monitoring system 101, with reference to the flowchart shown in FIG. 14. This processing starts when, for example, the power monitoring system 101 is powered on, and ends when the power monitoring system 101 is powered off.

In step S1, the power flow direction detection unit 173 executes initialization processing. The initialization processing will now be described in detail with reference to the flowchart shown in FIG. 15.

In step S21, the power flow direction detection unit 173 resets a timer, whereby the timer starts timing.

In step S22, the power flow direction detection unit 173 sets the value of a counter phase_index to 0. The counter phase_index is used to count the number of times the value of the EXOR signal was changed.

In step S23, the power flow direction detection unit 173 detects the value of the EXOR signal supplied from the EXOR circuit 152.

In step S24, the power flow direction detection unit 173 determines whether or not the value of the EXOR signal is 1. If it is determined that the value of the EXOR signal is 1, the processing advances to step S25.

In step S25, the power flow direction detection unit 173 sets the value of a predetermined flag Flag_upstart to 1. The flag Flag_upstart is used to store the initial value of the EXOR signal at the time when the timer starts timing.

In step S26, the power flow direction detection unit 173 permits interruption upon falling edges of the EXOR signal. For example, the power flow direction detection unit 173 sets the value of a predetermined interruption permission flag IES_phase to 1 such that when the EXOR signal changes from 1 to 0, an interruption handler (not shown) notifies interruption.

After that, the initialization processing ends.

If, on the other hand, it is determined in step S24 that the value of the EXOR signal is 0, the processing advances to step S27.

In step S27, the power flow direction detection unit 173 sets the value of the above-described flag Flag_upstart to 0.

In step S28, the power flow direction detection unit 173 permits interruption upon rising edges of the EXOR signal. For example, the power flow direction detection unit 173 sets the value of the above-described interruption permission flag IES_phase to 0 such that when the EXOR signal changes from 0 to 1, the interruption handler (not shown) notifies interruption.

After that, the initialization processing ends.

Returning to FIG. 14, in step S2, the power monitoring system 101 starts detection of the current direction. That is, the following processing is started.

The current transformer 111p transforms the current ip1 flowing through the generated power line to the current ip2. The current direction detection unit 161p generates a current direction detection signal Dp indicating the direction of the current ip1 based on the plus/minus sign of the voltage vp2 converted from the current ic2 by the diode provided in the rectifier 162p and the resistor 163p, and supplies the generated signal Dp to the EXOR circuit 152 and the waveform restoring unit 172p.

Likewise, the current transformer 111c transforms the current ic1 flowing through the commercial power line to the current ic2. The current direction detection unit 161c generates a current direction detection signal Dc indicating the direction of the current ic1 based on the plus/minus sign of voltage vc2 converted from the current ic2 by the diode provided in the rectifier 162c and the resistor 163c, and supplies the generated signal Dc to the EXOR circuit 152 and the waveform restoring unit 172c.

In step S3, the power monitoring system 101 starts detection of current waveforms. That is, the following processing is started.

The current ip2 output from the current transformer 111p is full-wave rectified by the rectifier 162p, thereafter converted into a voltage by the resistor 163p, amplified by the instrumentation amplifier 164p, and supplied to the ADC 171p. The ADC 171p A/D converts the full-wave rectified signal Sp1 supplied from the instrumentation amplifier 164p into a digital full-wave rectified signal Sp2 at a predetermined sampling frequency, and supplies the generated full-wave rectified signal Sp2 to the waveform restoring unit 172p.

The waveform restoring unit 172p generates a restored signal Sp3 in which the waveform of the current ip1 has been restored based on the full-wave rectified signal Sp2 and the current direction detection signal Dp. A specific example of processing performed by the waveform restoring unit 172p will now be described with reference to FIGS. 16 and 17.

Figure 16:
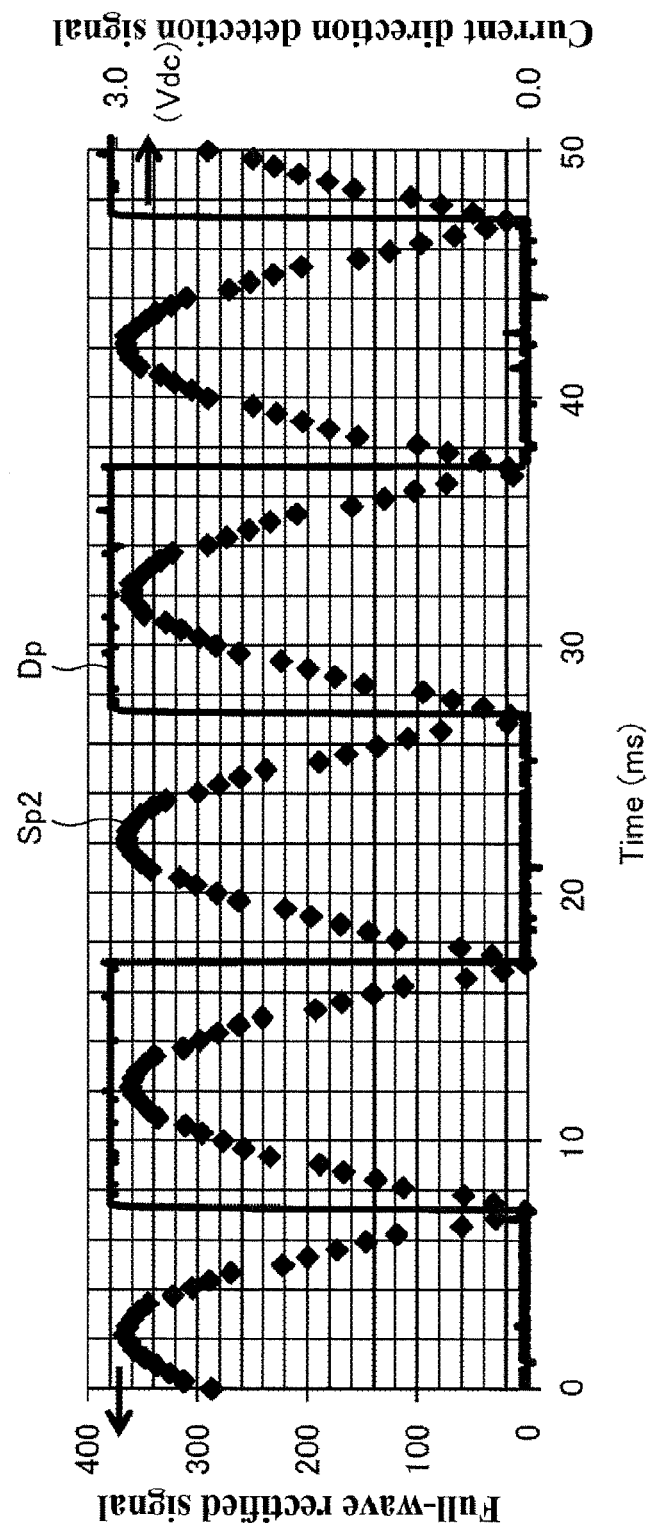
FIG. 16 is a diagram illustrating a method for restoring a current waveform.
Figure 17:
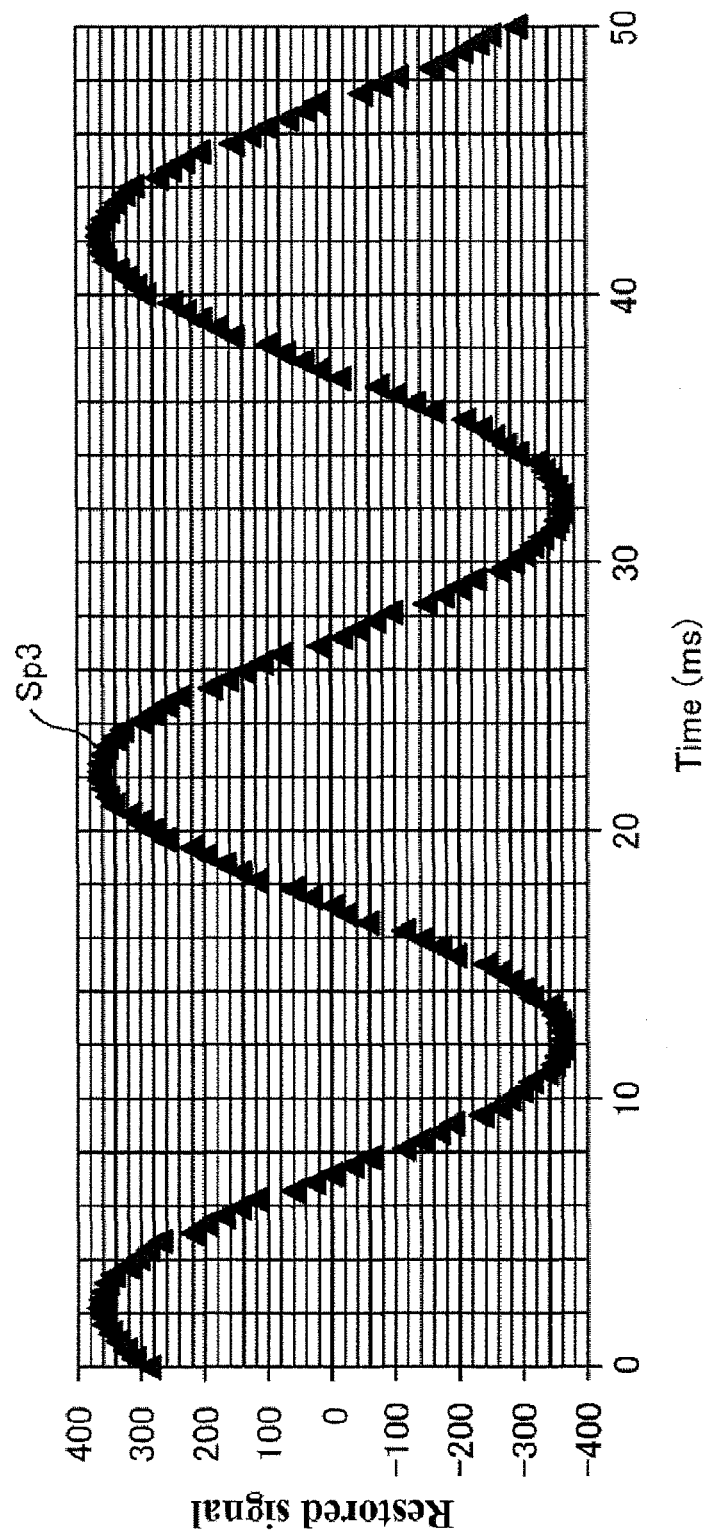
FIG. 17 is a diagram illustrating the method for restoring a current waveform.

FIG. 16 shows a specific example of the full-wave rectified signal Sp2 and the current direction detection signal Dp input into the waveform restoring unit 172p. Among the sampling values of the full-wave rectified signal Sp2, the sign of the sampling values when the current direction detection signal Dp is at a high level is inverted by the waveform restoring unit 172p, and the sampling values when the current direction detection signal Dp is at a low level is not changed. A restored signal Sp3 shown in FIG. 17 is thereby generated from the full-wave rectified signal Sp2 shown in FIG. 16.

The waveform restoring unit 172p supplies the restored signal Sp3 generated in the above-described manner to the power calculation unit 174. The power calculation unit 174 calculates an effective value irp1 of the current ip1 based on the restored signal Sp3.

Likewise, the current ic2 output from the current transformer 111c is full-wave rectified by the rectifier 162c, thereafter converted into a voltage by the resistor 163c, amplified by the instrumentation amplifier 164c, and supplied to the ADC 171c. The ADC 171c A/D converts the full-wave rectified signal Sc1 supplied from the instrumentation amplifier 164c into a digital full-wave rectified signal Sc2 at a predetermined sampling frequency, and supplies the generated full-wave rectified signal Sc2 to the waveform restoring unit 172c.

As with the waveform restoring unit 172p, the waveform restoring unit 172c generates a restored signal Sc3 in which the waveform of the current ic1 has been restored based on the full-wave rectified signal Sc2 and the current direction detection signal Dc. The waveform restoring unit 172c supplies the generated restored signal Sc3 to the power calculation unit 174. The power calculation unit 174 calculates an effective value irc1 of the current ic1 based on the restored signal Sc3.

In step S4, the power flow direction detection unit 173 determines whether or not interruption has been notified. For example, the interruption handler executed by the computation unit 153 sets the value of a predetermined interruption flag IFG_phase to 1 when the value of the EXOR signal changes from to 1 in the case where interruption upon rising edges of the EXOR signal is permitted, or when the value of the EXOR signal changes from 1 to 0 in the case where interruption upon falling edges of the EXOR signal is permitted. If the value of the interruption flag IFG_phase is set to 1, the power flow direction detection unit 173 determines that interruption has been notified, and the processing advances to step S5.

Figure 18:
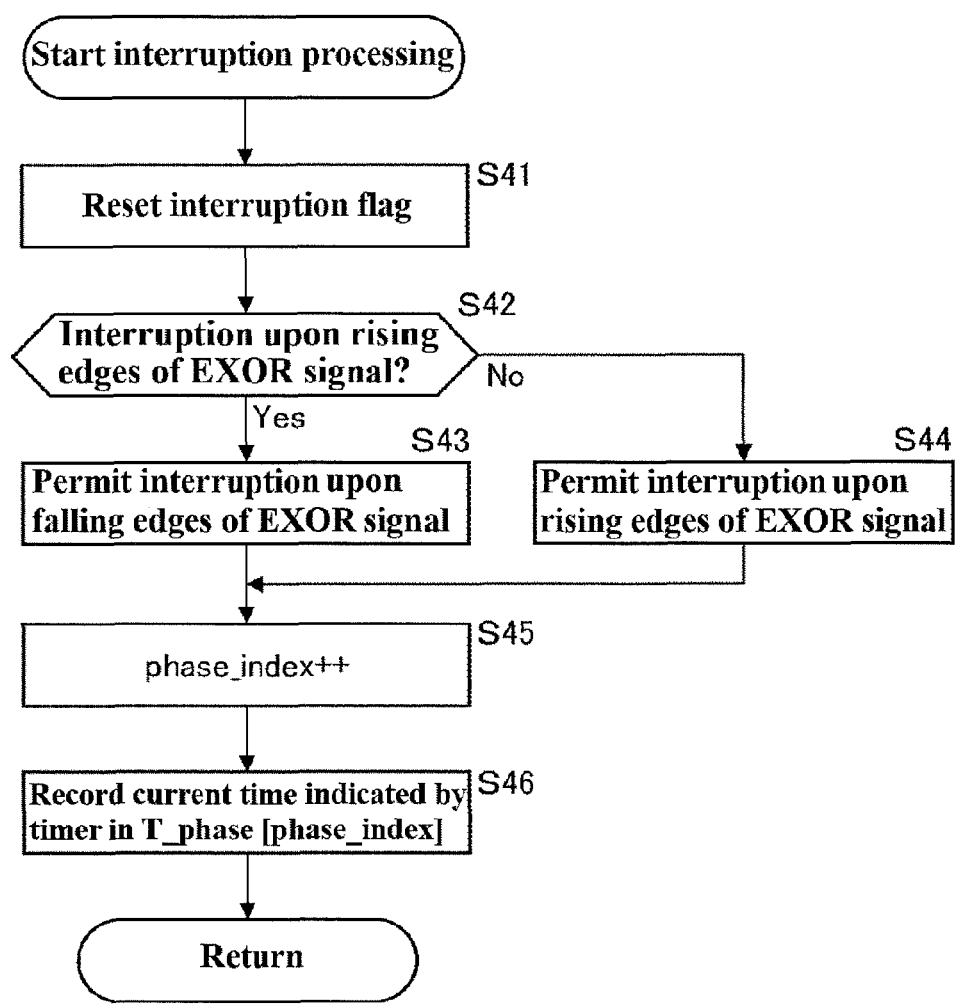
FIG. 18 is a flowchart illustrating interruption processing in detail.

In step S5, the power flow direction detection unit 173 executes interruption processing, and thereafter the processing advances to step S6. The interruption processing performed in step S5 will now be described in detail with reference to the flowchart shown in FIG. 18.

In step S41, the power flow direction detection unit 173 resets the value of the interruption flag IFG_phase to 0.

In step S42, the power flow direction detection unit 173 determines whether or not the interruption is interruption upon rising edges of the EXOR signal. The power flow direction detection unit 173 determines that the interruption is interruption on rising edges of the EXOR signal if the value of the interruption permission flag IES_phase is set to 0, and the processing advances to step S43.

Figure 15:
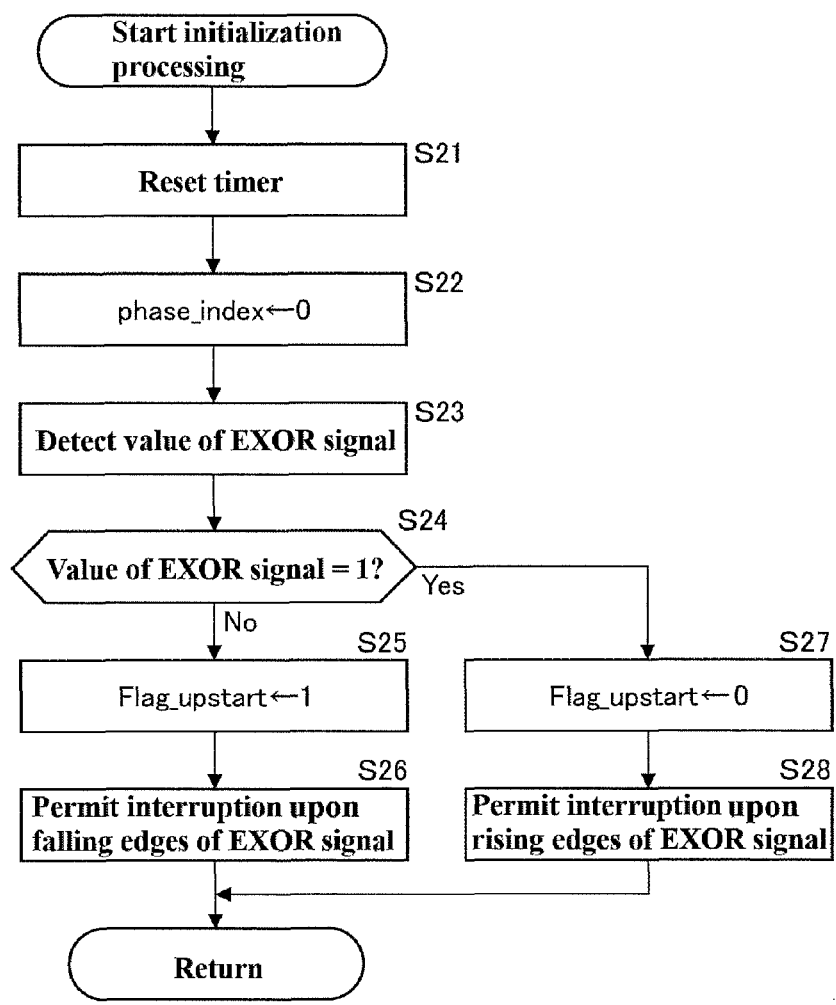
FIG. 15 is a flowchart illustrating initialization processing in detail.

In step S43, in the same manner as in the processing of step S26 of FIG. 15, interruption on falling edges of the EXOR signal is permitted.

After that, the processing advances to step S45.

On the other hand, in step S42, the power flow direction detection unit 173 determines that the interruption is interruption upon falling edges of the EXOR signal if the value of the interruption permission flag IES_phase is set to 1, and the processing advances to step S44.

In step S44, in the same manner as in the processing of step S28 of FIG. 15, interruption on rising edges of the EXOR signal is permitted.

After that, the processing advances to step S45.

In step S45, the power flow direction detection unit 173 increases the value of the counter phase_index by one.

In step S46, the power flow direction detection unit 173 records the current time indicated by the timer in an array variable T_phase [phase_index]. The time at which the value of the EXOR signal changed this time is thereby recorded.

After that, the interruption processing ends.

Returning to FIG. 14, in step S4, if, on the other hand, the value of the interruption flag IFG_phase is set to 0, the power flow direction detection unit 173 determines that interruption has not been notified, and the processing in step S5 is skipped, and the processing advances to step S6.

In step S6, the power flow direction detection unit 173 determines whether or not a detection period has elapsed. If it is determined that the predetermined detection period has not yet elapsed after start of timing by the timer in step S21 of FIG. 15, the processing returns to step S4. The detection period is set to, for example, a time period corresponding to n cycles of the commercial power supply 103 (where n is a natural number, and may be, for example, 5).

After that, the processing from step S4 to step S6 is repeatedly executed until it is determined in step S6 that the detection period has elapsed. The number of times the value of the EXOR signal changed and the time at which the value of the EXOR signal changed are recorded.

If, on the other hand, it is determined in step S6 that the detection period has elapsed, the processing advances to step S7.

In step S7, the computation unit 153 executes power flow direction determining processing. The power flow direction determining processing will now be described in detail with reference to the flowchart shown in FIG. 19.

In step S61, the power flow direction detection unit 173 determines whether or not the current of the generated power line has a value less than or equal to a specified value. To be specific, the power flow direction detection unit 173 acquires the calculated value of the effective value irp1 of the current ip1 from the power calculation unit 174. Then, the power flow direction detection unit 173 compares the effective value irp1 of the current ip1 with the specified value. If it is determined that the effective value irp1 of the current ip1 is greater than the specified value, the processing advances to step S62.

In step S62, the power flow direction detection unit 173 determines whether or not the current of the commercial power line is greater than the current of the generated power line. To be specific, the power flow direction detection unit 173 acquires the calculated value of the effective value irc1 of the current ic1 from the power calculation unit 174. Then, the power flow direction detection unit 173 compares the effective value irc1 of the current ic1 with the effective value irp1 of the current ip1. If the effective value irc1 of the current ic1 is less than or equal to the effective value irp1 of the current ip1, the processing advances to step S63.

In step S63, the power flow direction detection unit 173 determines whether or not the counter phase_index is 0. If it is determined that the counter phase_index is not 0, the processing advances to step S64. This indicates the case where the value of the EXOR signal changed at least once during the detection period.

In step S64, the power flow direction detection unit 173 first sets the value of the counter i to 0.

Next, the power flow direction detection unit 173 adds a value of T_phase [2*i+1]−T_phase [2*i] to a variable T_phase_add, and thereafter increases the value of the counter i by one. Then, the power flow direction detection unit 173 repeats this processing until the counter i reaches counter phase_index/2 or more.

Through this, a total time length during which the EXOR signal had a value equal to the initial value (=Flag_upstart) set at the time when the timer started timing during the time period from the start of timing by the timer until the elapse of the detection period is finally set in the variable T_phase_add.

After that, the processing advances to step S66.

If on the other hand, it is determined in step S63 that the counter phase_index is not 0, the processing advances to step S65. This indicates the case where the value of the EXOR signal did not change at all during the detection period.

In step S65, the power flow direction detection unit 173 sets the detection period in the variable T_phase_add. That is, in this case, the value of the EXOR signal remains at the initial value during the time period from the start of timing by the timer until the elapse of the detection period, and thus the detection period is set in the variable T_phase_add as the total time length during which the EXOR signal had a value equal to the initial value.

After that, the processing advances to step S66.

In step S66, the power flow direction detection unit 173 determines whether or not the flag Flag_upstart is 1. If it is determined that the flag Flag_upstart is 1, the processing advances to step S67.

In step S67, the power flow direction detection unit 173 determines whether or not variable T_phase_add≥detection period/2 has been satisfied. If it is determined that variable T_phase_add≥detection period/2 has been satisfied, the processing advances to step S68. This indicates the case where the time length during which the EXOR signal had a value of 1 is greater than or equal to the time length during which the EXOR signal had a value of 0, or in other words, the case where the time length during which the directions (plus/minus signs) of the current ip1 and the current ic1 did not match is greater than or equal to the time length during which they matched.

In step S68, the power flow direction detection unit 173 determines that the solar power generation system is in the power selling state. Then, the power flow direction detection unit 173 notifies the power calculation unit 174 of the determined result.

After that, the processing advances to step S74.

If, on the other hand, it is determined in step S67 that variable T_phase_add≥detection period/2 has been satisfied, the processing advances to step S69. This indicates the case where the time length during which the EXOR signal had a value of 1 is shorter than the time length during which the EXOR signal had a value of 0, or in other words, the case where the time length during which the directions (plus/minus signs) of the current ip1 and the current ic1 did not match is shorter than the time length during which they matched.

In step S69, the power flow direction detection unit 173 determines that the solar power generation system is in the power purchasing state. Then, the power flow direction detection unit 173 notifies the power calculation unit 174 of the determined result.

After that, the processing advances to step S74.

If, on the other hand, it is determined in step S66 that the flag Flag_upstart is 0, the processing advances to step S70.

In step S70, the power flow direction detection unit 173 determines whether or not variable T_phase_add≥detection period/2 has been satisfied. If it is determined that variable T_phase_add≥detection period/2 has been satisfied, the processing advances to step S71. This indicates the case where the time length during which the EXOR signal had a value of 0 is greater than or equal to the time length during which the EXOR signal had a value of 1, or in other words, the case where the time length during which the directions (plus/minus signs) of the current ip1 and the current ic1 matched is greater than or equal to the time length during which they did not match.

In step S71, the power flow direction detection unit 173 determines that the solar power generation system is in the power purchasing state. Then, the power flow direction detection unit 173 notifies the power calculation unit 174 of the determined result.

After that, the processing advances to step S74.

If, on the other hand, it is determined in step S70 that variable T_phase_add<detection period/2 has been satisfied, the processing advances to step S72. This indicates the case where the time length during which the EXOR signal had a value of 0 is shorter than the time length during which the time length during which the EXOR signal had a value of 1, or in other words, the case where the time length during which the directions (plus/minus signs) of the current ip1 and the current ic1 matched is shorter than the time length during which they did not match.

In step S72, the power flow direction detection unit 173 determines that the solar power generation system is in the power selling state. Then, the power flow direction detection unit 173 notifies the power calculation unit 174 of the determined result.

After that, the processing advances to step S74.

A description is now given of the validity of the determined result of the power flow direction of the commercial-side power obtained through steps S66 to S72.

It has been empirically known that common household loads have a power factor of $\cos(\pi/6)$ or greater for most of the time. Accordingly, the phase difference between the voltage waveform and the current waveform is $\pi/6$ or less.

Figure 20:
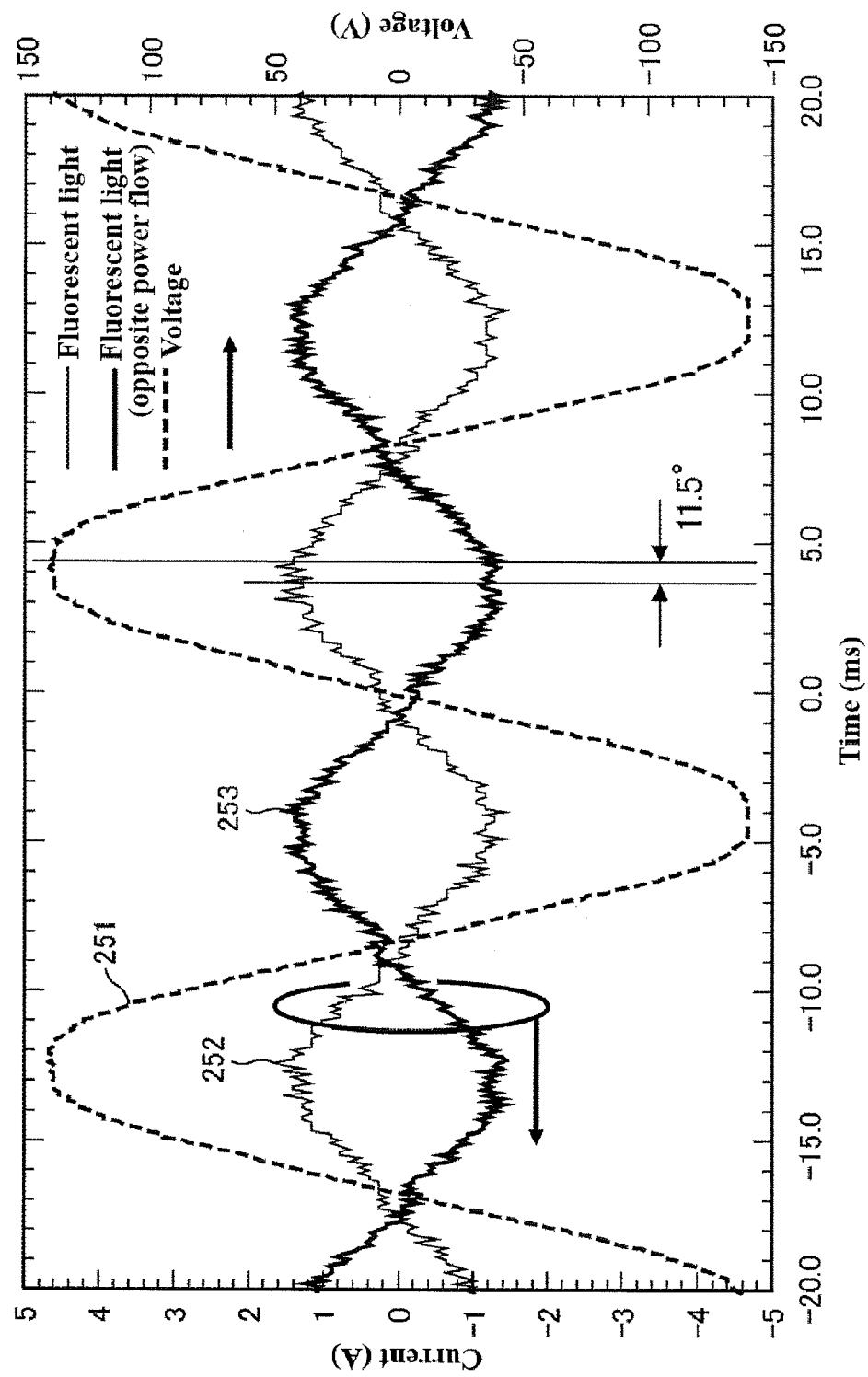
FIG. 20 is a graph showing a first example of a phase difference between voltage and current with a load.

For example, FIG. 20 is a graph showing a result obtained by applying an alternating current voltage of 100 V to a fluorescent light and measuring the current by using a current transformer. In FIG. 20, the horizontal axis indicates time, and the vertical axis indicates voltage and current. A waveform 251 indicates the waveform of voltage. A waveform 252 indicates the waveform of current when a current transformer is attached in a direction in which the current value is positive in the case where the voltage and the current have the same phase. A waveform 253 is the waveform of current when the current transformer is attached in a direction in which the current value is positive in the case where the voltage and the current have opposite phases. In this case, the phase difference between the voltage applied to the fluorescent light and the current flowing through the fluorescent light is approximately 11.5 degrees ($<\pi/6$).

Figure 21:
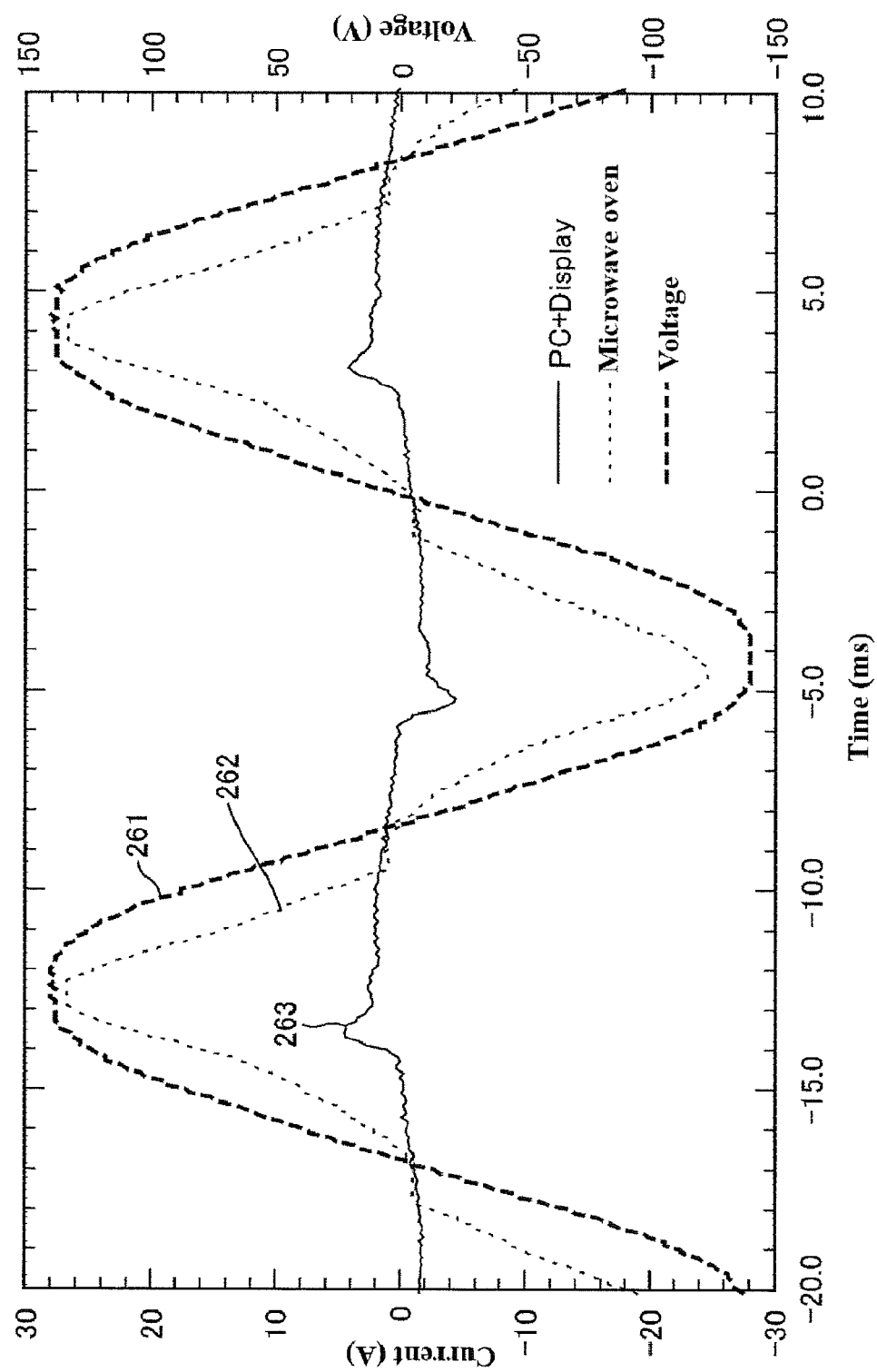
FIG. 21 is a graph showing a second example of a phase difference between voltage and current with a load.

Also, FIG. 21 is a graph showing a result obtained by applying an alternating current voltage of 100 V to another load, and measuring the current by using a current transformer attached in a direction in which the current value is positive in the case where the voltage and the current have the same phase. In FIG. 21, the horizontal axis indicates time, and the vertical axis indicates voltage and current. A waveform 261 indicates the waveform of voltage. A waveform 262 indicates the waveform of current in the case where the load is a microwave oven. A waveform 263 indicates the waveform of current in the case where the load is a personal computer and a display. In this example as well, the phase difference between the voltage and the current is less than $\pi/6$.

Accordingly, an assumption can be made that the phase difference between the voltage vp1 and the current ip1 of the generated power line is within $\pm\pi/6$. Also, the phase difference between the voltage vc1 and the current ic1 of the commercial power line is within $\pm\pi/6$ in the case of the power purchasing state, and is within a range of $\pi\pm\pi/6$ in the case of the power selling state.

Accordingly, in the case of the power purchasing state, $|\phi p-\phi c|\leq\pi/3$, where the phase of the current ip1 is $\phi p$, and the phase of the current ic1 is $\phi c$, an assumption can be made that the time length during which the directions (plus/minus signs) of the current ip1 and the current ic1 match is longer than the time length during which they do not mach in one frequency of the commercial power supply 103. On the other hand, in the case of power selling state, $2\pi/3\leq|\phi p-\phi c|\leq\pi$, and thus an assumption can be made that the time length during which the directions (plus/minus signs) of the current ip1 and the current ic1 do not match is longer than the time length during which they mach in one frequency of the commercial power supply 103.

Accordingly, as described above, a comparison is made between the length of time during which the directions (plus/minus signs) of the current ip1 and the current ic1 do not match during a predetermined detection period and the length of time during which they do not match, and thereby the power flow direction of the commercial-side power can be accurately determined.

Returning to FIG. 19, if, on the other hand, it is determined in step S61 that the current of the generated power line has a value less than or equal to a specified value or it is determined in step S62 that the current of the commercial power line is greater than the current of the generated power line, the processing advances to step S73.

In step S73, the power flow direction detection unit 173 determines that the solar power generation system is in the power purchasing state. Then, the power flow direction detection unit 173 notifies the power calculation unit 174 of the power purchasing state.

After that, the processing advances to step S74.

Figure 22:
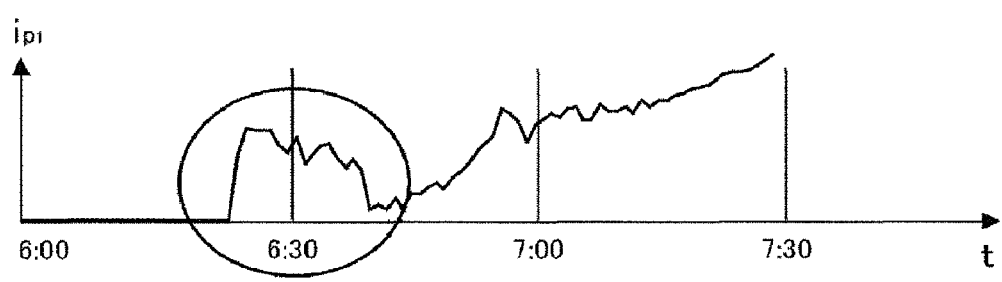
FIG. 22 is a graph showing a first example of a state in which a generated power line has a minimum power factor.

With the power monitoring system 101, the power factor of the current ip1 may become minimum immediately before the solar cell module 121 starts power generation or immediately after the solar cell module 121 ends power generation. For example, FIG. 22 shows an example of transition of the effective value of the current ip1 before and after the solar cell module 121 starts power generation in the morning. An area surrounded by a circle in FIG. 22 indicates the time slot immediately before the solar cell module 121 starts power generation. As can be seen in this example, the current ip1 may flow regardless of the fact that the solar cell module 121 is not generating power. At this time, the current ip1 is generated primarily due to current flowing into a capacitive load, such as a capacitor, provided in the power conditioner 122, and thus has a phase significantly different from the current ip1 when the solar cell module 121 is generating power.

Figure 23:
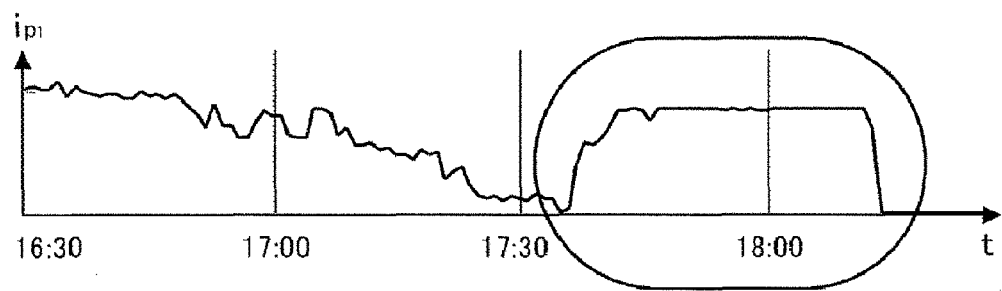
FIG. 23 is a graph showing a second example of a state in which the generated power line has a minimum power factor.

On the other hand, FIG. 23 shows an example of transition of the effective value of the current ip1 before and after the solar cell module 121 stops power generation in the evening. An area surrounded by a circle in FIG. 23 indicates the time slot immediately after the solar cell module 121 stops power generation. As can be seen in this example, the current ip1 may flow regardless of the fact that the solar cell module 121 is not generating power. At this time, the current ip1 is also generated primarily due to current flowing into a capacitive load, such as a capacitor, provided in the power conditioner 122, and has a phase significantly different from the current ip1 when the solar cell module 121 is generating power.

As described above, in the circled time slots shown in FIGS. 22 and 23, as a result of flow of the current ip1 having a phase significantly different from that when the solar cell module 121 is generating power, the result of detection of the power flow direction of the commercial-side power may be opposite to the actual result. That is, a situation may occur in which despite the fact that the solar cell module 121 is not generating power, it is determined that the power flow direction of the commercial-side power is in the power selling state, or in which despite the fact that power is purchasing from the commercial power supply 103, it is determined that power is being sold. If such a situation occurs when, for example, a large amount of power is purchasing from the commercial power supply 103 due to the power consumption of the load 104 being large, a significant error is made in the calculated power for sale and the calculated purchased power.

Accordingly, in step S61, by determining the power purchasing state if it is determined that the current of the generated power line has a value less than or equal to a specified value, it is possible to prevent a situation in which the power flow direction is erroneously detected to be in the power selling state when the current ip1 takes a minimum value such as around 6:45 and 17:35, which respectively correspond to the beginning and end of the circled time slots in FIGS. 22 and 23.

In step S61, a situation may occur in which when the current ip1 is small due to the amount of power generated by the solar cell module 121 being small, the power flow direction is erroneously detected to be in the power purchasing state despite the fact that it is in the power selling state. However, it is unlikely that when the amount of power generated by the solar cell module 121 is small, excess power is produced, and the power selling state is established. Accordingly, the possibility of the occurrence of erroneous detection is very low. Even if erroneous detection occurs, the amount of power is small, and thus the influence of the erroneous detection is very small.

Also, in the case of the power selling state, a state in which the effective value irc1 of the current ic1 is greater than the effective value irp1 of the current ip1 corresponds to a state in which power in an amount greater than the amount of power generated by the solar power generation system 102 is being supplied to the commercial power supply 103, and such a state does not, in fact, occur. Thus, if it is determined that the effective value irc1 of the current ic1 is greater than the effective value irp1 of the current ip1, by unconditionally determining that it is in the power purchasing state, the erroneous detection of the power flow direction can be avoided.

Returning to FIG. 19, in step S74, the power flow direction detection unit 173 executes the initialization processing described above with reference to FIG. 15. Through this processing, the timer is reset and then starts timing, and the values of the flags, the variables and the like are initialized.

After that, the power flow direction determining processing ends.

Returning to FIG. 14, in step S8, the power calculation unit 174 calculates each power.

To be specific, where the generated power of the solar power generation system 102 is denoted by Pp, the power calculation unit 174 calculates the generated power Pp by using the following Equation (1).

$$Pp=vrp1 \times irp1 \times PFp \tag{1}$$

In the equation, vrp1 represents the effective value of the voltage vp1, and for example, a nominal value of output voltage of the solar power generation system 102 is used. It is also possible to acquire a measured value of the effective value of the voltage vp1 from the solar power generation system 102, and use the value.

PFp represents the power factor of the generated power line, and is for example, a constant set based on an experimental result, an actually measured result, or a theoretical expression.

Also, where the purchased power is denoted by Pcb, and the power for sale is denoted by Pcs, the power calculation unit 174 calculates the purchased power Pcb and the power for sale Pcs by using the following Equations (2) and (3) if it is determined that the solar power generation system is in the power purchasing state.

$$Pcb=vrc1 \times irc1 \times PFc \tag{2}$$

$$Pcs=0 \tag{3}$$

In the equation, vrc1 represents the effective value of the voltage vc1, and for example, a nominal voltage of the commercial power supply 103 is used. Control is performed such that the output voltage of the solar power generation system 102 is equal to the voltage of the commercial power supply 103, and thus it is possible to acquire a measured value of the effective value of the voltage vp1 from the solar power generation system 102, and use the value as the voltage vrc1.

PFc represents the power factor of the commercial power line, and is for example, a constant set based on an experimental result, an actually measured result, or a theoretical expression.

If, on the other hand, it is determined that the solar power generation system is in the power selling state, the power calculation unit 174 calculates the purchased power Pcb and the power for sale Pcs by using the following Equations (4) and (5).

$$Pcb=0 \tag{4}$$

$$Pcs=vrc1 \times irc1 \times PFc \tag{5}$$

Note that the right-hand side of Equation (2) and the right-hand side of Equation (5) are equal.

If it is determined that the solar power generation system is in the power purchasing state, the power calculation unit 174 calculates load power Pl of the load 104 by using the following Equation (6).

$$Pl=vrc1 \times (irp1+irc1) \times PFl \tag{6}$$

PFl represents the power factor of the load power line, and is, for example, a constant set based on an experimental result, an actually measured result, or a theoretical expression.

If, on the other hand, it is determined that the solar power generation system is in the power selling state, the power calculation unit 174 calculates the load power Pl of the load 104 by using the following Equation (7).

$$Pl=vrc1 \times (irp1-irc1) \times PFl \tag{7}$$

Then, the power calculation unit 174 notifies the display unit 154 and the communication unit 155 of the calculated value of each power.

In step S9, the display unit 154 displays the state of each power. For example, the display unit 154 displays the generated power Pp, the power for sale Pcs, the purchased power Pcb and the load power Pl that have been calculated, in the form of a numerical or time-series graph. Also, the display unit 154 shows that the solar power generation system is in the power purchasing state or in the power selling state on its screen by using, for example, characters, signs, icons or the like, or by lighting or flashing of an LED or the like, or changing the color.

This enables the user to know the state of each power in the house.

In step S10, the communication unit 155 notifies the state of each power. To be specific, the communication unit 155 transmits, to an external apparatus, the generated power Pp, the power for sale Pcs, the purchased power Pcb and the load power Pl that have been calculated, and power state information including information indicating whether the solar power generation system is in the power purchasing state or in the power selling state.

The external apparatus serving as the transmission destination stores the received information, and analyzes power usage status based on the received information, for example.

The power state information may further include the measured values of the current ip1 and the current ic1. Also, not all information described above needs to be transmitted, and it is possible to, for example, select information that needs to be transmitted according to the need of the transmission destination apparatus.

Furthermore, the transmission of the power state information does not necessarily need to be performed each time the power monitoring processing loops, and the power state information may be transmitted at a predetermined timing such as, for example, at a predetermined time interval, or when the amount of information stored exceeds a predetermined amount. Alternatively, the power state information may be transmitted in response to a request from the external apparatus.

After that, the processing returns to step S4, and the processing from step S4 onward is executed.

With the above-described configuration, the power flow direction of the commercial-side power can be detected by simply installing only the current transformers 111p and 111c on the power line without installing a voltage measurement device on the power line, and measuring the current ip1 and the current ic1. Also, the generated power, the power for sale, the purchased power, and the consumed power can be measured.

Accordingly, it is possible to install the power monitoring system 101 safely and without the need of cutting off the supply of power, which enables easy installation of the power monitoring system 101 and a reduction of necessary cost. As a result, it is possible to detect a state of power, with ease and at a low cost. Furthermore, as a result of the voltage measurement device that requires high levels of safety and reliability being omitted, the safety and reliability of the power monitoring system 101 as a whole are improved.

Also, the power sources 165p and 165c are charged with currents of the current transformer 111p and the current transformer 111c, and the detection apparatus 112 is operated by using the charged power, and thereby the detection apparatus 112 can be operated in a stable manner for a long period of time without the need of battery replacement.

Furthermore, full-wave rectified waveforms are input into the ADC 171p and the ADC 171c, and it is thereby possible to measure the current ip1 and the current ic1 with a resolution twice that when waveforms are input without being full-wave rectified. Alternatively, it is possible to set dynamic ranges of the ADC 171p and the ADC 171c to ½ as compared to when waveforms are input without being full-wave rectified.

Power Monitoring Processing of Second Embodiment

Figure 24:
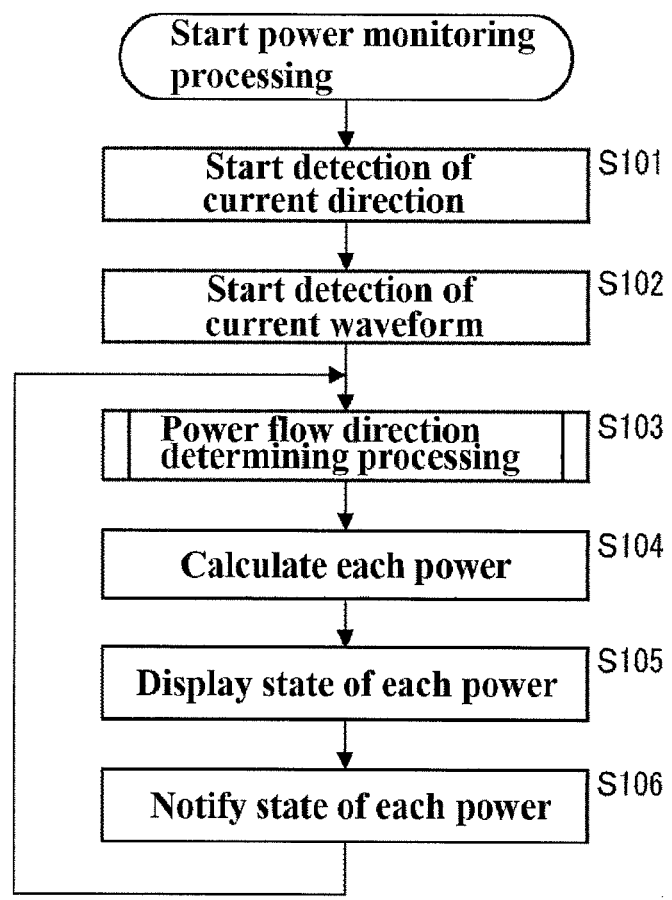
FIG. 24 is a flowchart illustrating power monitoring processing according to a second embodiment.

Next is a description of power monitoring processing according to a second embodiment executed by the power monitoring system 101, with reference to the flowchart shown in FIG. 24. This processing starts when, for example, the power monitoring system 101 is powered on, and ends when the power monitoring system 101 is powered off.

In step S101, in the same manner as in the processing of step S2 of FIG. 14, current direction detection is started.

In step S102, in the same manner as in the processing of step S3 of FIG. 14, current waveform detection is started.

Figure 25:
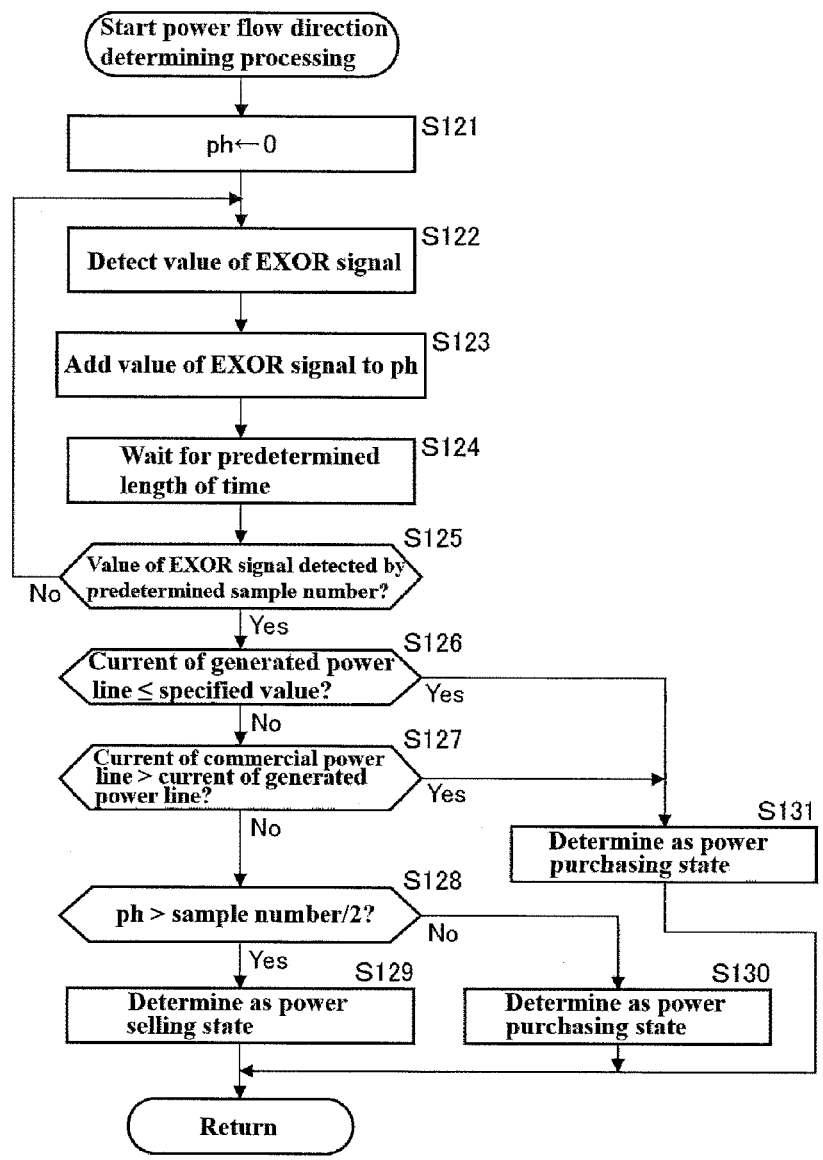
FIG. 25 is a flowchart illustrating power flow direction determining processing according to the second embodiment in detail.

In step S103, the power flow direction detection unit 173 executes power flow direction determining processing. The power flow direction determining processing will now be described in detail with reference to the flowchart shown in FIG. 25.

In step S121, the power flow direction detection unit 173 sets the value of the counter ph to 0.

In step S122, the power flow direction detection unit 173 detects the value of the EXOR signal. This processing is performed by, for example, interruption processing.

In step S123, the power flow direction detection unit 173 adds the value of the EXOR signal to the counter ph. Accordingly, the value of the counter ph is increased by one if the value of the EXOR signal is 1, and the value of the counter ph is not changed if the value of the EXOR signal is 0.

In step S124, the power flow direction detection unit 173 waits for a predetermined length of time.

In step S125, the power flow direction detection unit 173 determines whether or not the value of the EXOR signal has been detected a predetermined sample number of times. If it is determined that the value of the EXOR signal has not been detected the predetermined sample number of times, the processing returns to step S122.

After that, the processing from step S122 to S125 is repeatedly executed until it is determined in step S125 that the value of the EXOR signal has been detected the predetermined sample number of times. Through this, the value of the EXOR signal is detected at a predetermined interval during a predetermined detection period, and the number of times the detected value of the EXOR signal was 1 is recorded in the counter ph. For example, the detection interval is set to 312.5 microseconds, the sample number of times is set to 320, and the detection period is set to 0.1 seconds. It is also possible to set the detection period to, for example, a time period corresponding to n cycles of the commercial power supply 103 (where n is a natural number).

If, on the other hand, it is determined in step S125 that the value of the EXOR signal has been detected the predetermined sample number of times, the processing advances to step S126.

Figure 19:
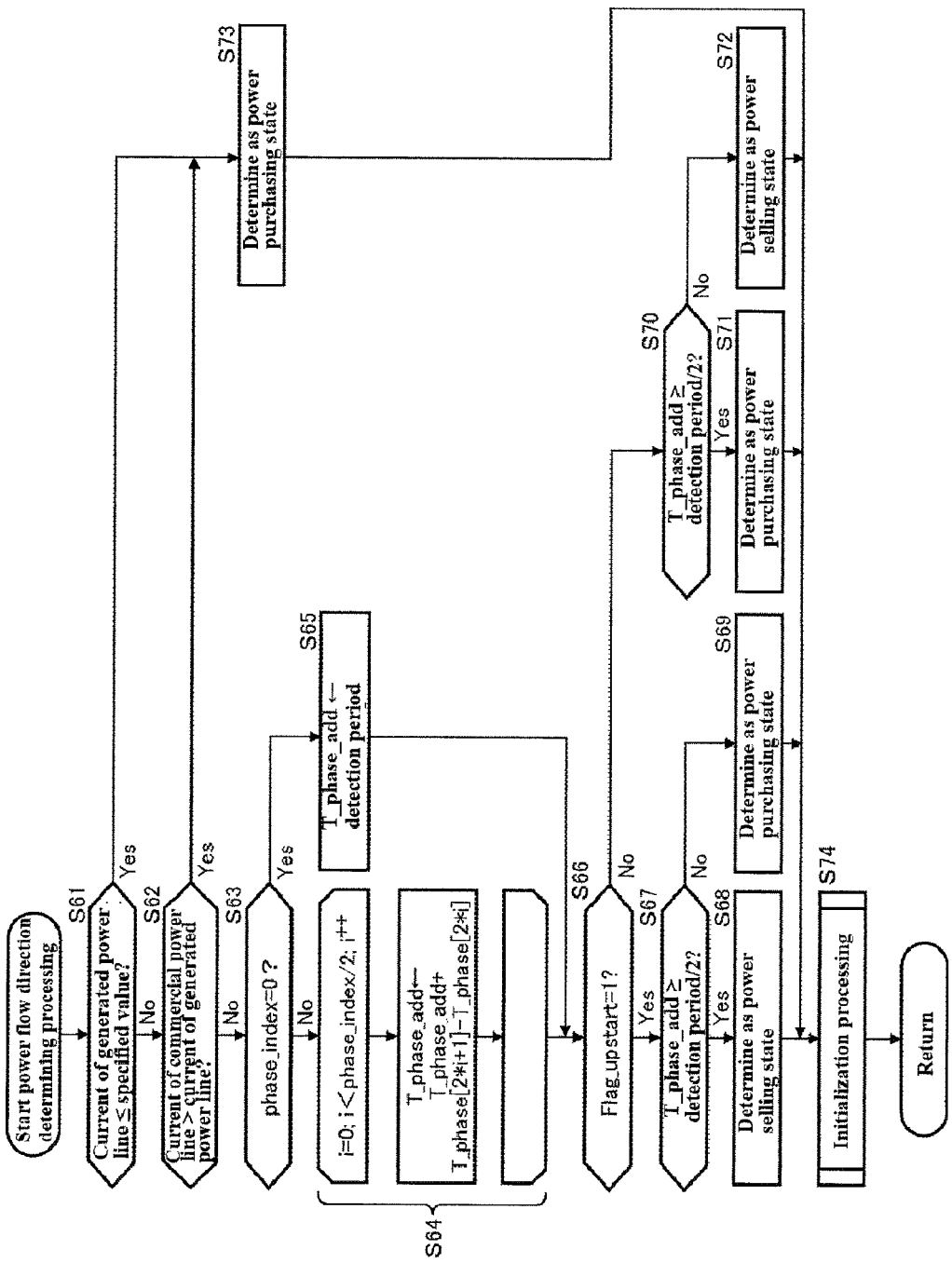
FIG. 19 is a flowchart illustrating power flow direction determining processing according to the first embodiment in detail.

In step S126, in the same manner as in the processing of step S61 of FIG. 19, it is determined whether or not the current of the generated power line has a value less than or equal to a specified value. If it is determined that the current of the generated power line is greater than the specified value, the processing advances to step S127.

In step S127, in the same manner as in the processing of step S62 of FIG. 19, it is determined whether or not the current of the commercial power line is greater than the current of the generated power line. If it is determined that the current of the commercial power line is less than or equal to the current of the generated power line, the processing advances to step S128.

In step S128, the power flow direction detection unit 173 determines whether or not counter ph>sample number of times/2 is satisfied. If it is determined that counter ph>sample number of times/2 is satisfied, the processing advances to step S129. This indicates the case where the number of times the detected value of the EXOR signal was 1 is greater than the number of times the detected value of the EXOR signal was 0, or in other words, the case where the number of times the directions (plus/minus signs) of the current ip1 and the current ic1 did not match is greater than the number of times they matched.

In step S129, the power flow direction detection unit 173 determines that the solar power generation system is in the power selling state. Then, the power flow direction detection unit 173 notifies the power calculation unit 174 of the determined result.

After that, the power flow direction determining processing ends.

If, on the other hand, it is determined in step S128 that counter ph≤sample number of times/2 is satisfied, the processing advances to step S130. This indicates the case where the number of times the detected value of the EXOR signal was 1 is less than or equal to the number of times the detected value of the EXOR signal was 0, or in other words, the case where the number of times the directions (plus/minus signs) of the current ip1 and the current ic1 did not match is less than or equal to the number of times they matched.

In step S130, the power flow direction detection unit 173 determines that the solar power generation system is in the power purchasing state. Then, the power flow direction detection unit 173 notifies the power calculation unit 174 of the determined result.

After that, the power flow direction determining processing ends.

A description is now given of the validity of the determined result of the power flow direction of the commercial-side power obtained through steps S128 to S130.

As described above, in the case of the power purchasing state, an assumption can be made that the time length during which the directions (plus/minus signs) of the current ip1 and the current ic1 match is longer than the time length during which they do not match. On the other hand, in the case of the power selling state, an assumption can be made that the time length during which the directions (plus/minus signs) of the current ip1 and the current ic1 do not match is longer than the time length during which they match Accordingly, as described above, by detecting whether or not the directions (plus/minus signs) of the current ip1 and the current ic1 match at a predetermined interval during a predetermined detection period, and making a comparison between the number of times they match and the number of times they do not match, the power flow direction of the commercial-side power can be accurately determined.

If, on the other hand, it is determined in step S126 that the current of the generated power line has a value less than or equal to a specified value, or it is determined in step S127 that the current of the commercial power line is greater than the current of the generated power line, the processing advances to step S131.

In step S131, the power flow direction detection unit 173 determines that the solar power generation system is in the power purchasing state. Then, the power flow direction detection unit 173 notifies the power calculation unit 174 of the fact that the solar power generation system is in the power purchasing state.

After that, the power flow direction determining processing ends.

Returning to FIG. 24, in step S104, in the same manner as in the processing of step S8 of FIG. 14, each power is calculated.

In step S105, in the same manner as in the processing of step S9 of FIG. 14, the state of each power is displayed.

In step S106, in the same manner as in the processing of step S10 of FIG. 14, the state of each power is notified.

After that, the processing returns to step S103, and the processing from step S103 onward is executed.

With the above-described configuration, as in the case of the power monitoring processing according to the first embodiment, the power flow direction of the commercial-side power can be detected by simply installing only the current transformers 111p and 111c on the power line without installing a voltage measurement device on the power line, and measuring the current ip1 and the current ic1. Also, the generated power, the power for sale, the purchased power, and the consumed power can be measured.

When a comparison is made between the power monitoring processing of the first embodiment and the power monitoring processing of the second embodiment, in the power monitoring processing of the first embodiment, the number of times interruption processing is performed can be reduced, and the power consumption can be reduced. On the other hand, in the power monitoring processing of the second embodiment, the interruption processing is performed regularly, so that strict time management of various processing operations is possible.

2. Variations

Hereinafter, variations of the above-described embodiments of the present invention will be described.

The foregoing has been described taking an example in which one or more embodiments of the present invention is applied to a single-phase two-wire power system, but one or more embodiments of the present invention is also applicable to a single-phase three-wire power system.

Figure 26:
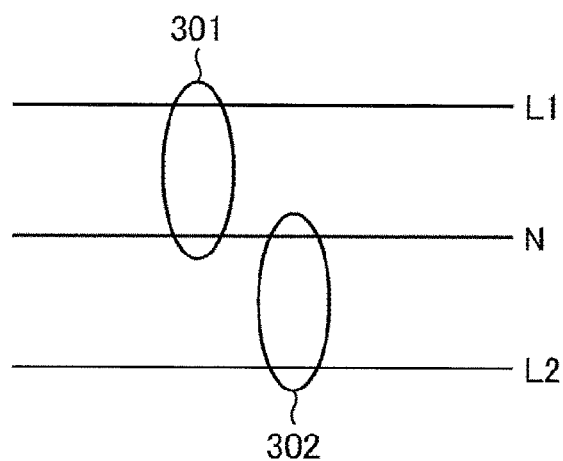
FIG. 26 is a diagram showing an example of a method for installing current transformers in the case of a single-phase three-wire power system.

FIG. 26 shows an example of a method for installing current transformers in the case of a single-phase three-wire power system. As shown in FIG. 26, it is sufficient that two current transformers, namely, a current transformer 301 and a current transformer 302 are provided respectively between a voltage line L1 and a neutral line N (hereinafter, referred to as the "L1 phase"), and between a voltage line L2 and the neutral line N (hereinafter, referred to as the "L2 phase").

In the case of a single-phase three-wire power system, when measurement of the current ip1 and the current ic1 is performed intermittently in series, it is better to continuously measure the currents in the same phase such as, for example, measuring the current ip1 in the L1 phase, the current ic1 in the L1 phase, the current ip1 in the L2 phase, the current ic1 in the L2 phase, and so on.

Also, the installation direction of the current transformer 111p and the current transformer 111c is not limited to the above example, and can be set to any direction. In the case where one of the current transformer 111p and the current transformer 111c is installed in a direction opposite to the direction of the above example, the determined result of the power flow direction of the commercial-side power will be opposite to that of the above example.

Furthermore, the circuit that implements the current direction detection unit 161p and the current direction detection unit 161c is not limited to the examples shown in FIGS. 3 to 5, and it is possible to use any circuit as long as the level of output signal changes by the plus/minus sign of input voltage. Also, the correspondence between the plus/minus sign of input voltage and the level of output signal may be opposite to that of the above example. To be specific, the level of output voltage may be high when the input voltage is positive, and low when the input voltage is negative.

Furthermore, for example, in the circuit used as the current direction detection unit 161p (or the current direction detection unit 161c) shown in FIG. 3, the non-inverting input terminal (+) of the operational amplifier 201 may be connected to the terminal K of the current transformer 111c (or the current transformer 111p). This causes the potential difference between the terminal K and the terminal L of the current transformer 111c (or the current transformer 111p) to be greater than the potential difference between the terminal L and the ground, which makes it difficult for a detection error to occur when the current ip1 (or the current ic1) is very small.

It is also possible to calculate the effective value irp1 of the current ip1 based on the full-wave rectified signal Sp2 before it is restored. Likewise, it is possible to calculate the effective value irc1 of the current ic1 based on the full-wave rectified signal Sc2 before it is restored.

Furthermore, it is possible to charge the power source 165p with a current obtained by half-wave rectifying the current ip1. Likewise, it is possible to charge the power source 165c with a current obtained by half-wave rectifying the current ic1.

Also, the power generated by the current ip2 output from the current transformer 111p may be subjected to voltage conversion and supplied to each unit of the detection apparatus 112, instead of being charged into the power source 165p. Likewise, the power generated by the current ic2 output from the current transformer 111c may be subjected to voltage conversion and supplied to each unit of the detection apparatus 112, instead of being charged into the power source 165c.

Also, the power output from the current transformer 111c or the current transformer 111p and rectified does not necessarily need to cover all driving power of the detection apparatus 112, and may cover only a part of the driving power. That is, the rectified power may be used as one of a plurality of power sources of the detection apparatus 112.

Furthermore, it is also possible to omit either one or both of the determination processing in step S61 and the determination processing in step S62 shown in FIG. 19. Likewise, it is also possible to omit either one or both of the determination processing in step S126 and the determination processing in step S127 shown in FIG. 18.

In the detection apparatus 112, it is also possible to remove either one of the display unit 154 and the communication unit 155 as needed.

Also, in the detection apparatus 112, the processing of the EXOR circuit 152 may be performed by the computation unit 153 without providing the EXOR circuit 152.

Furthermore, in one or more embodiments of the present invention, other than a solar power generation apparatus, any type of private power generation apparatus can be used such as a wind power generation apparatus, a diesel power generation apparatus, and a fuel cell apparatus.

One or more embodiments of the present invention is also applicable to, other than the power system provided in an ordinary house, power systems provided in various types of facilities equipped with a private power generation apparatus, including, for example, a building, a plant, a commercial facility, and a public facility.

Configuration Example of Computer

The above-described series of processing of the detection apparatus 112 may be executed by hardware, or may be executed by software. In the case where the series of processing is executed by software, a program constituting the software is installed on a computer. As used herein, the computer encompasses a computer embedded in dedicated hardware, a general-purpose personal computer that can execute various functions by installing various programs, and the like.

Figure 27:
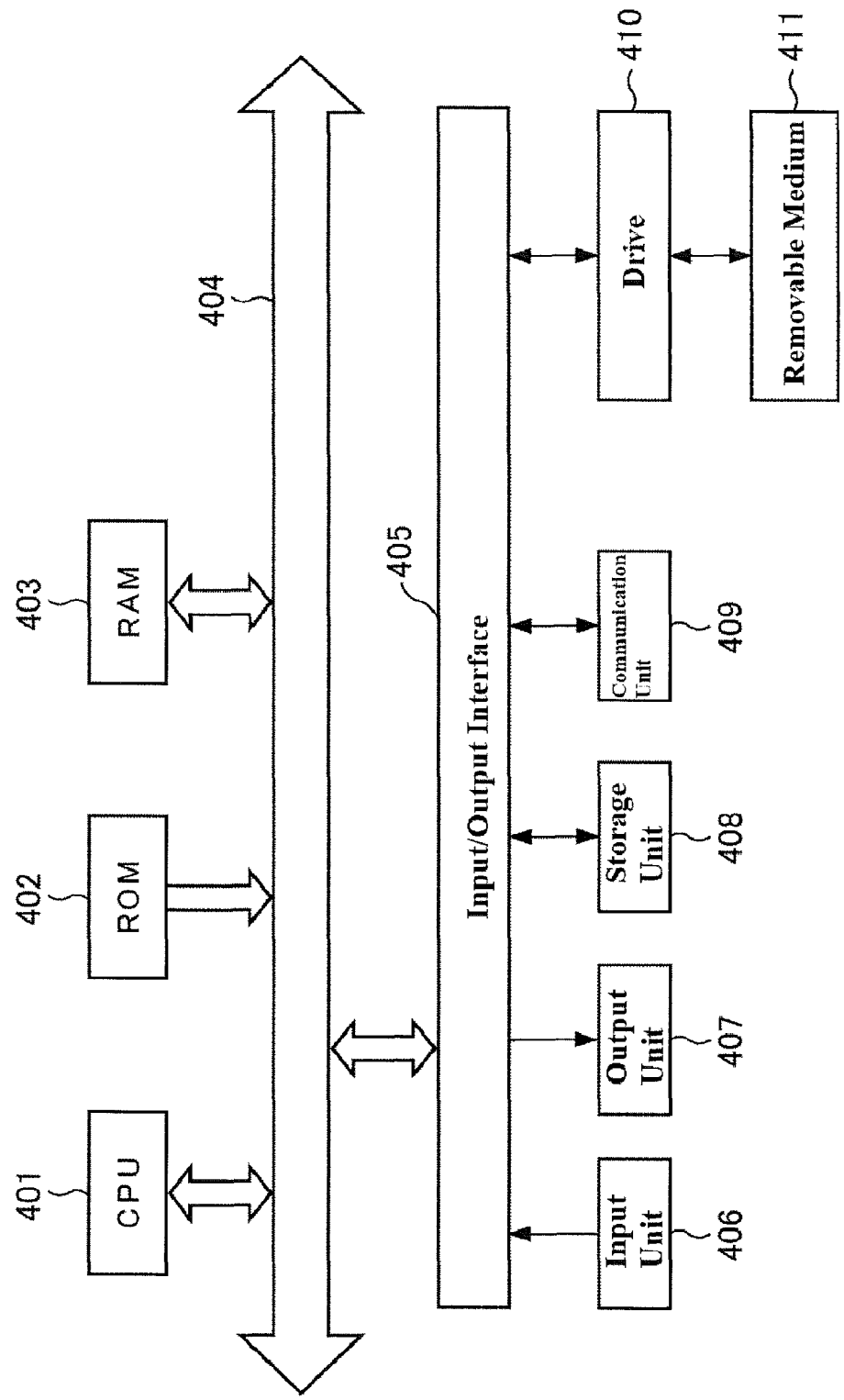
FIG. 27 is a block diagram showing a configuration example of a computer.

FIG. 27 is a block diagram showing a configuration example of hardware of a computer that executes the above-described series of processing by using a program.

In the computer, a central processing unit (CPU) 401, a read only memory (ROM) 402, and a random access memory (RAM) 403 are mutually connected by a bus 404.

The bus 404 is also connected to an input/output interface 405. The input/output interface 405 is connected to an input unit 406, an output unit 407, a storage unit 408, a communication unit 409, and a drive 410.

The input unit 406 includes a keyboard, a mouse, a microphone, and the like. The output unit 407 includes a display, a speaker, and the like. The storage unit 408 includes a hard disk, a non-volatile memory, and the like. The communication unit 409 includes a network interface, and the like. The drive 410 drives a removable medium 411 such as a magnetic disc, an optical disc, a magneto-optical disc, or a semiconductor memory.

In the computer configured as described above, the CPU 401 executes a program stored in, for example, the storage unit 408 by loading the program into the RAM 403 via the input/output interface 405 and the bus 404, and thereby the above-described series of processing is performed.

The program executed by the computer (the CPU 401) can be distributed by being recorded in the removable medium 411 such as a package medium. The program can also be distributed via wired or wireless transmission media including a local area network, the Internet, and digital satellite broadcasting.

In the computer, the program can be installed on the storage unit 408 via the input/output interface 405 by inserting the removable medium 411 into the drive 410. Also, the program can be installed on the storage unit 408 by receiving the program by the communication unit 409 via a wired or wireless transmission medium. Alternatively, the program may be pre-installed on the ROM 402 or the storage unit 408.

The program executed by the computer may be a program that executes processing in time series according to the processing order described in the specification of the present application or in parallel, or a program that executes processing at a necessary timing such as when it is invoked.

Also, in the specification of the present application, the term "system" refers to an all-inclusive apparatus including a plurality of apparatuses, means, and the like. That is, in the specification of the present application, the system means a collection of a plurality of constituent elements (apparatuses, modules (components), and the like), and not all constituent elements need to be housed in the same casing. Accordingly, a plurality of apparatuses that are housed in separate casings and connected via a network, and a single apparatus including a plurality of modules housed in a single casing are also construed as systems.

Furthermore, the embodiments of the present invention are not limited to the embodiments described above, and various modifications can be made within the scope that does not depart from the gist of the present invention.

For example, the present invention may take a configuration of cloud computing in which a single function is allocated to a plurality of apparatuses and processed collectively by the plurality of apparatuses via a network.

Also, the steps described in the flowcharts described above may be executed by a single apparatus, or may be allocated to and executed by a plurality of apparatuses.

Furthermore, in the case where a plurality of processing steps are included in a single step, the plurality of processing steps included in the single step may be executed by a single apparatus, or may be allocated to and executed by a plurality of apparatuses.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

INDEX TO THE REFERENCE NUMERALS

101 Power Monitoring System
102 Solar Power Generation System
103 Commercial Power supply
111p, 111c Current Transformer
112 Detection Apparatus
121 Solar Cell Module
122 Power Conditioner
151p, 151c Current Detection Unit
152 EXOR Circuit
153 Computation Unit
154 Display Unit
155 Communication Unit
161p, 161c Current Direction Detection Unit
162p, 162c Rectifier
163p, 163c Resistor
164p, 164c Instrumentation Amplifier
165p, 165c Power Source
171p, 171c AD Converter
172p, 172c Waveform Restoring Unit
173 Power Flow Direction Detection Unit
174 Power Calculation Unit

The invention claimed is:

1. A detection apparatus that detects a state of power comprising:
a first current transformer that measures a first current on a side of a first power line with respect to a connecting point between the first power line extending from a commercial power supply and a second power line extending from a power generation means that supplies power having the same frequency as the commercial power supply;
a second current transformer that measures a second current on a side of the second power line with respect to the connecting point;
a first current direction detector that detects a direction of the first current;
a second current direction detector that detects a direction of the second current;
an exclusive OR calculator that calculates an exclusive OR between a detected value of the direction of the first current and a detected value of the direction of the second current; and
a power flow direction detector that detects a power flow direction of the first power line based on the exclusive OR.

2. The detection apparatus according to claim 1, wherein the power flow direction detector detects the power flow direction of the first power line based on a time length during which the exclusive OR takes a predetermined value within a predetermined detection period.

3. The detection apparatus according to claim 1, wherein the power flow direction detector detects a value of the exclusive OR at a predetermined interval, and detects the power flow direction of the first power line based on the number of times the detected value of the exclusive OR takes a predetermined value within a predetermined detection period.

4. The detection apparatus according to claim 1, further comprising:
a first full-wave rectification unit that generates a first full-wave rectified waveform of a third current transformed from the first current by the first current transformer;
a second full-wave rectification unit that generates a second full-wave rectified waveform of a fourth current transformed from the second current by the second current transformer;
a first waveform restoring unit that restores a waveform of the first current based on the first full-wave rectified waveform and the detected value of the direction of the first current; and
a second waveform restoring unit that restores a waveform of the second current based on the second full-wave rectified waveform and the detected value of the direction of the second current.

5. The detection apparatus according to claim 1, further comprising:
a rectification unit that rectifies at least one of a third current transformed from the first current by the first current transformer and a fourth current transformed from the second current by the second current transformer,
wherein power generated by the current rectified by the rectification unit is used as at least one power source.

6. The detection apparatus according to claim 1, further comprising:

a power calculator that calculates a first power supplied from the commercial power supply to the first power line and a second power supplied from the power generation means to the first power line based on a measured value of the first current and the power flow direction of the first power line.

7. The detection apparatus according to claim 6, wherein the power calculator further calculates a third power supplied to a load connected to the connecting point based on the measured value of the first current, a measured value of the second current, and the power flow direction of the first power line.

8. The detection apparatus according to claim 6, further comprising:
a display unit that displays the first power and the second power.

9. The detection apparatus according to claim 1, wherein the power flow direction detector determines that the power flow direction of the first power line is a direction in which power is supplied from the commercial power supply when the first current has an effective value that is greater than an effective value of the second current.

10. The detection apparatus according to claim 1, wherein the power flow direction detector determines that the power flow direction of the first power line is a direction in which power is supplied from the commercial power supply when the second current has an effective value that is less than or equal to a specified value.

11. A detection method comprising:
measuring a first current on a side of a first power line with respect to a connecting point between the first power line extending from a commercial power supply and a second power line extending from a power generation means that supplies power having the same frequency as the commercial power supply, performed by a first current transformer;
measuring a second current on a side of the second power line with respect to the connecting point, performed by a second current transformer;
detecting a direction of the first current;
detecting a direction of the second current;
calculating an exclusive OR between a detected value of the direction of the first current and a detected value of the direction of the second current; and
detecting a power flow direction of the first power line based on the exclusive OR.

12. A detection apparatus comprising:
a first current direction detector that detects a direction of a first current measured by a first current transformer on a side of a first power line with respect to a connecting point between the first power line extending from a commercial power supply and a second power line extending from a power generation means that supplies power having the same frequency as the commercial power supply;
a second current direction detector that detects a direction of a second current measured by a second current transformer on a side of the second power line with respect to the connecting point;
an exclusive OR calculator that calculates an exclusive OR between a detected value of the direction of the first current and a detected value of the direction of the second current; and a power flow direction detector that detects a power flow direction of the first power line based on the exclusive OR.

13. A detection method comprising the following steps performed by a detection apparatus that detects a state of power:
   detecting a direction of a first current measured by a first current transformer on a side of a first power line with respect to a connecting point between the first power line extending from a commercial power supply and a second power line extending from a power generation means that supplies power having the same frequency as the commercial power supply;
   detecting a direction of a second current measured by a second current transformer on a side of the second power line with respect to the connecting point;
   calculating an exclusive OR between a detected value of the direction of the first current and a detected value of the direction of the second current; and
   detecting a power flow direction of the first power line based on the exclusive OR.

14. A program stored on a computer readable medium for causing a computer to perform:
   detecting a direction of a first current measured by a first current transformer on a side of a first power line with respect to a connecting point between the first power line extending from a commercial power supply and a second power line extending from a power generation means that supplies power having the same frequency as the commercial power supply;
   detecting a direction of a second current measured by a second current transformer on a side of the second power line with respect to the connecting point;
   calculating an exclusive OR between a detected value of the direction of the first current and a detected value of the direction of the second current; and
   detecting a power flow direction of the first power line based on the exclusive OR.

* * * * *